United States Patent
Asami et al.

(10) Patent No.: US 10,753,574 B2
(45) Date of Patent: Aug. 25, 2020

(54) SINTERED PHOSPHOR, LIGHT EMITTING DEVICE, ILLUMINATION DEVICE, VEHICLE HEADLAMP, AND METHOD FOR MANUFACTURING SINTERED PHOSPHOR

(71) Applicant: Mitsubishi Chemical Corporation, Chiyoda-ku (JP)

(72) Inventors: Harumi Asami, Chiyoda-ku (JP); Yukihiro Miyamoto, Chiyoda-ku (JP); Minoru Soma, Chiyoda-ku (JP); Tadahiro Katsumoto, Chiyoda-ku (JP); Kentarou Horibe, Chiyoda-ku (JP)

(73) Assignee: Mitsubishi Chemical Corporation, Chiyoda-ku (JP)

( * ) Notice: Subject to any disclaimer, the term of this patent is extended or adjusted under 35 U.S.C. 154(b) by 294 days.

(21) Appl. No.: 15/656,537

(22) Filed: Jul. 21, 2017

(65) Prior Publication Data

US 2017/0321866 A1 Nov. 9, 2017

Related U.S. Application Data

(63) Continuation of application No. PCT/JP2016/051615, filed on Jan. 20, 2016.

(30) Foreign Application Priority Data

Jan. 21, 2015 (JP) ................. 2015-009736
Mar. 26, 2015 (JP) ................. 2015-064864

(51) Int. Cl.
| | | |
|---|---|---|
| *F21V 9/30* | (2018.01) | |
| *C09K 11/02* | (2006.01) | |
| *F21V 3/04* | (2018.01) | |
| *H01L 33/50* | (2010.01) | |
| *C09K 11/77* | (2006.01) | |
| *F21S 41/141* | (2018.01) | |
| *F21S 41/20* | (2018.01) | |
| *B60Q 1/04* | (2006.01) | |
| *F21Y 115/10* | (2016.01) | |
| *C09K 11/08* | (2006.01) | |

(52) U.S. Cl.
CPC ............... *F21V 9/30* (2018.02); *B60Q 1/04* (2013.01); *C09K 11/02* (2013.01); *C09K 11/7734* (2013.01); *C09K 11/7774* (2013.01); *F21S 41/141* (2018.01); *F21S 41/285* (2018.01); *F21V 3/04* (2013.01); *H01L 33/50* (2013.01); *C09K 11/0883* (2013.01); *F21Y 2115/10* (2016.08)

(58) Field of Classification Search
CPC . C09K 11/02; C09K 11/0883; C09K 11/7734; C09K 11/7774; H01L 33/501; F21S 41/141; F21S 41/285; B60Q 1/04
See application file for complete search history.

(56) References Cited

U.S. PATENT DOCUMENTS

| | | | | |
|---|---|---|---|---|
| 7,963,817 | B2 * | 6/2011 | Kameshima | .......... C03C 14/004 313/512 |
| 8,445,929 | B2 * | 5/2013 | Krames | .................. B82Y 30/00 257/98 |
| 2007/0257231 | A1 | 11/2007 | Hirosaki | |
| 2009/0072700 | A1 | 3/2009 | Kameshima et al. | |
| 2010/0085728 | A1 | 4/2010 | Seto et al. | |
| 2014/0239228 | A1 | 8/2014 | Ishizawa | |
| 2015/0299566 | A1 | 10/2015 | Kinoshita et al. | |
| 2016/0152515 | A1 * | 6/2016 | Okamoto | ................ C03C 3/325 252/301.4 F |

FOREIGN PATENT DOCUMENTS

| | | |
|---|---|---|
| CN | 101724401 A | 6/2010 |
| DE | 10 2013 205 329 A1 | 10/2014 |
| JP | 2003-292946 | 10/2003 |
| JP | 2004-161871 A | 6/2004 |
| JP | 2006-117876 | 5/2006 |
| JP | 2008-502131 | 1/2008 |
| JP | 2008-53545 | 3/2008 |
| JP | 2008-60428 | 3/2008 |
| JP | 2009-91546 | 4/2009 |
| JP | 2014-145012 | 8/2014 |

(Continued)

OTHER PUBLICATIONS

Combined Chinese Office Action and Search Report dated Nov. 15, 2018 in Patent Application No. 201680006879.8, 29 pages (with English language translation).
Chinese Office Action dated Jun. 19, 2019 in Chinese Patent Application No. 201680006879.8 (with unedited computer generated English translation), 25 pages.
Extended European Search Report dated Jan. 5, 2018 in Patent Application No. 16740230.4, 8 pages.
International Preliminary Report on Patentability and Written Opinion dated Aug. 3, 2017 in PCT/JP2016/051615 (submitting English language translation only).
International Search Report dated Feb. 16, 2016 in PCT/JP2016/051615 filed on Jan. 20, 2016.

(Continued)

*Primary Examiner* — C Melissa Koslow
(74) *Attorney, Agent, or Firm* — Oblon, McClelland, Maier & Neustadt, L.L.P.

(57) ABSTRACT

Provided is a sintered phosphor-composite for an LED, having high heat resistance, high thermal conductivity, high luminance, and high conversion efficacy. In addition, there are provided: a light-emitting apparatus which uses the sintered phosphor-composite; and an illumination apparatus and a vehicular headlamp which use the light-emitting apparatus. The sintered phosphor-composite includes a nitride phosphor and a fluoride inorganic binder. The sintered phosphor-composite preferably has an internal quantum efficiency of 60% or more when excited by blue light having a wavelength of 450 nm. Further, the sintered phosphor-composite preferably has a transmittance of 20% or more at a wavelength of 700 nm.

10 Claims, 3 Drawing Sheets

(56) References Cited

FOREIGN PATENT DOCUMENTS

| | | |
|---|---|---|
| JP | 2014-172940 | 9/2014 |
| JP | 2014-201726 | 10/2014 |
| JP | 2015-8171 | 1/2015 |
| JP | 2016/051615 | 1/2016 |
| WO | WO 2005/119797 A1 | 12/2005 |
| WO | WO 2008/132954 A1 | 11/2008 |
| WO | WO 2009/154193 A1 | 12/2009 |
| WO | WO 2013/073592 A1 | 5/2013 |
| WO | WO 2014/046173 A1 | 3/2014 |
| WO | WO 2015/008621 * | 1/2015 |
| WO | WO 2015/008621 A1 | 1/2015 |

OTHER PUBLICATIONS

Office Action as received in the corresponding Patent Application No. 201680006879.8 dated Feb. 3, 2020 w/English Translation , 26 pages.

Office Action as received in the corresponding Patent Application No. 16 740 230.4-1105 dated Jan. 10, 2020 , 5 pages.

Office Action as received in the corresponding Patent Application No. 2016-570689 dated Dec. 3, 2019 w/English Translation, 4 pages.

\* cited by examiner

SINTERED PHOSPHOR, LIGHT EMITTING DEVICE, ILLUMINATION DEVICE, VEHICLE HEADLAMP, AND METHOD FOR MANUFACTURING SINTERED PHOSPHOR

CROSS-REFERENCE TO RELATED APPLICATION

This is a continuation of International Application PCT/JP2016/051615, filed on Jan. 20, 2016, and designated the U.S., and claims priority from Japanese Patent Application No. 2015-009736 which was filed on Jan. 21, 2015 and Japanese Patent Application No. 2015-064864 which was filed on Mar. 26, 2015, the entire contents of which are incorporated herein by reference.

TECHNICAL FIELD

The present invention relates to: a sintered phosphor-composite and a plate-like sintered phosphor-composite including a nitride phosphor and a fluoride inorganic binder; a light-emitting apparatus using the plate-like sintered phosphor-composite; an illumination apparatus and a vehicular headlamp using the light-emitting apparatus; and a method for producing a sintered phosphor-composite.

BACKGROUND ART

A light-emitting diode (LED) is widely known as a semiconductor light-emitting apparatus or a semiconductor light source which can emit light having a peak wavelength in a specific region of an optical spectrum. Typically, LEDs are used as light sources for illuminators, signs, in-vehicle headlamps, and displays. A light-emitting device emitting white light, in which an LED chip emitting blue light and a YAG (yttrium aluminum garnet) phosphor that converts blue light into yellow are combined, is known as a light-emitting device using an LED and a phosphor. The YAG phosphor is arranged, around the LED chip, as a wavelength conversion light-emitting layer dispersed in an epoxy resin or a silicone resin. In addition to the wavelength conversion light-emitting layer dispersed in the resin, a ceramic layer including a phosphor, or a wavelength conversion light-emitting layer (light-emitting ceramic layer) in which a phosphor is dispersed in ceramic and which consists of an inorganic material is described as an example (Patent Document 1).

In recent years, many novel substances related to nitrides including ternary or higher order elements have been produced. In particular, phosphor materials with excellent properties have been recently developed in multinary nitrides and oxynitrides based on silicon nitride, and have been used in wavelength conversion light-emitting layers. These phosphor materials are known to be excited to emit yellow or red light by blue LEDs or near ultraviolet LEDs, and exhibit high luminance, high conversion efficacy, and in addition, the excellent dependence of luminous efficacy on temperature, in comparison with oxide-based phosphors (Patent Document 2).

Conventionally, wavelength conversion light-emitting layers dispersed in organic binders such as epoxy resins and silicone resins have had insufficient durability, heat resistance, and emission intensity. Therefore, a method for producing a wavelength conversion light-emitting layer (light-emitting ceramic layer) consisting of an inorganic material has been researched as described as an example in Patent Document 1 in order to obtain a wavelength conversion light-emitting layer superior in durability and heat resistance.

Patent Document 3 describes, as an example, phosphor ceramic in which YAG:Ce phosphor particles are dispersed in an inorganic binder including any one of calcium fluoride, strontium fluoride, and lanthanum fluoride or including calcium fluoride and strontium fluoride.

In Patent Document 4, a wavelength conversion light-emitting layer consisting of an inorganic material is produced with a combination of an $Y_3(Al, Ga)_5O_{12}$:Ce oxide phosphor or a $Lu_3Al_5O_{12}$:Ce oxide phosphor with a $CaSiAlN_3$:Eu ("CASN") nitride phosphor by melting a glass powder having a glass transition point of 200° C. or more by using a discharge plasma sintering method.

PRIOR ART DOCUMENT

Patent Document

Patent Document 1: National Publication of International Patent Application No. 2008-502131
Patent Document 2: International Publication No. WO 2008/132954
Patent Document 3: International Publication No. WO 2009/154193
Patent Document 4: Japanese Patent Laid-Open No. 2009-91546

SUMMARY OF INVENTION

Technical Problem to be Solved

In Patent Document 1, however, an aluminum garnet phosphor is used as the light-emitting ceramic layer. In this case, a YAG powder is produced with $Y_2O_3$, $Al_2O_3$ (99.999%), and $CeO_2$, and a molded product consisting of the YAG powder is obtained and then burnt at 1300° C., whereby a YAG sintered phosphor-composite is obtained and used as the light-emitting ceramic layer. The light-emitting ceramic layer uses no inorganic binder, and the sintered composite is formed only of a YAG oxide-based phosphor. Therefore, there has been demanded a sintered phosphor-composite with a nitride phosphor exhibiting high luminance, high conversion efficacy, and in addition, the excellent dependence of luminous efficacy on temperature.

As described as an example in Patent Document 3, there has been a problem that both the ceramic composites of a YAG oxide phosphor phase and a fluoride matrix phase have low internal quantum efficiency values of 55% or less.

In Patent Document 4, the glass powder is melted, whereby the combination of the YAG oxide phosphor or the LuAG oxide phosphor with the CASN nitride phosphor is dispersed in the glass to produce the wavelength conversion light-emitting layer; however, since an inorganic binder is the glass, there is a problem that in spite of heat resistance, a thermal conductivity is as low as 2 to 3 W/mK, in addition, a heat dissipation property is poor, and therefore, the temperature of a phosphor is increased, thereby decreasing luminance (deteriorating the phosphor).

In such a situation, there has been demanded a sintered phosphor-composite with a high thermal conductivity using a nitride phosphor excellent in internal quantum efficiency and temperature properties.

Solution to Problem

Sintering of an oxide phosphor and a fluoride inorganic binder has been conventionally considered to result in solid solution substitution because the ionic radii of oxygen in the phosphor and fluorine in the inorganic binder are commonly close to each other, to cause an acid fluoride to be formed, and to result in the deterioration of internal quantum efficiency. Thus, the present inventors found that the original internal quantum efficiency of a nitride phosphor can be maintained by mixing and sintering the nitride phosphor and a fluoride inorganic binder. This is considered to be because solid solution substitution hardly occurs in nitrogen and fluorine differing in ionic radius and the internal quantum efficiency can be prevented from deteriorating.

Use of a fluoride inorganic binder enables sintering temperature to be lower than use of, for example, $Al_2O_3$ as an inorganic binder, and therefore enables the reaction of a nitride phosphor and an inorganic binder to be suppressed. The present inventors considered that a sintered phosphor-composite with a nitride phosphor having a high internal quantum efficiency can be obtained in such a manner.

Further, for example, $Al_2O_3$ which is trigonal is birefringent, and therefore, making of $Al_2O_3$ into a sintered composite allows $Al_2O_3$ to become a polycrystalline substance and results in insufficient light-transmitting properties. In contrast, use of a fluoride inorganic binder such as $CaF_2$, $BaF_2$, or $SrF_2$ with a cubic crystal system enables a sintered phosphor-composite that is not birefringent but has high transparency to be produced.

As a result, the present inventors invented a sintered phosphor-composite for an LED with a high internal quantum efficiency, high heat resistance, a high transmittance, a low absorptance, and a high thermal conductivity by using a nitride phosphor. In addition, the present inventors invented an excellent light-emitting apparatus and an excellent illumination apparatus with high conversion efficacy and high luminance as well as with a low brightness variation and a small color deviation due to variations in excitation light intensity and temperature by using the sintered phosphor-composite.

The present invention is as follows.

(1) A sintered phosphor-composite including a nitride phosphor and a fluoride inorganic binder.

(2) The sintered phosphor-composite according to (1), wherein the sintered phosphor-composite has a transmittance of 20% or more at a wavelength of 700 nm.

(3) The sintered phosphor-composite according to (1) or (2), wherein the sintered phosphor-composite has an internal quantum efficiency of 60% or more when being excited by blue light having a wavelength of 450 nm.

(4) The sintered phosphor-composite according to any of (1) to (3), wherein the sintered phosphor-composite is a plate-like sintered phosphor-composite, and the plate-like sintered phosphor-composite has a thickness of 50 μm or more and 2000 μm or less.

(5) A light-emitting apparatus including: the sintered phosphor-composite according to any of (1) to (4); and an LED or a semiconductor laser as a light source, wherein the sintered phosphor-composite absorbs at least part of light from the light source and emits light having a different wavelength.

(6) An illumination apparatus including the light-emitting apparatus according to (5).

(7) A vehicular headlamp including the light-emitting apparatus according to (5).

(8) A method for producing a sintered phosphor-composite, the method including: a step of mixing a nitride phosphor and a fluoride inorganic binder; and a step of sintering, at a temperature of 400° C. or more and 1500° C. or less, the mixture obtained in the step.

(9) A sintered phosphor-composite including: a garnet-based phosphor that emits yellow or green light; a nitride phosphor that emits red light; and a fluoride inorganic binder.

(10) The sintered phosphor-composite according to (9), wherein the garnet phosphor that emits yellow or green light includes at least one of garnet phosphors selected from the group consisting of a YAG phosphor represented by the following general formula (1), a GYAG phosphor represented by the general formula (2), an LuAG phosphor represented by the general formula (3), and a phosphor represented by the general formula (4):

(a+b=3, 0≤b≤0.2, 4.5≤c+d≤5.5, 0≤c≤0.2, and 10.8≤e≤13.4 in the formula (1));

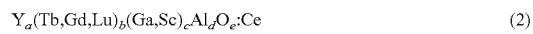

(a+b=3, 0≤b≤0.2, 4.5≤c+d≤5.5, 1.2≤c≤2.6, and 10.8≤e≤13.4 in the formula (2));

(a+b=3, 0≤c≤0.2, 4.5≤c+d≤5.5, 0≤d≤0.2, and 10.8≤e≤13.4 in the formula (3)); and

(a+b+f=3, 0≤b≤0.2, 4.5≤c+d≤5.5, 0≤c≤2.6, 10.8≤e≤13.4, and 0.1≤f≤1 in the formula (4)).

(11) The sintered phosphor-composite according to (9) or (10), wherein the nitride phosphor that emits red light includes at least one of nitride phosphors selected from the group consisting of CASN represented by the following general formula: $CaAlSiN_3$:Eu, SCASN represented by the following general formulae: $(Ca, Sr, Ba, Mg)AlSiN_3$:Eu and/or $(Ca, Sr, Ba)AlSiN_{3-x}O_x$:Eu (0<x<3), and $Sr_2Si_5N_8$ represented by the following general formula: $(Sr, Ca, Ba)_2Al_xSi_{5-x}O_xN_{8-x}$:Eu (0≤x≤2 in the formula).

(12) The sintered phosphor-composite according to any of (9) to (11), wherein the fluoride inorganic binder includes at least one selected from the group of $CaF_2$, $BaF_2$, $SrF_2$, $LaF_3$, and $MgF_2$.

(13) The sintered phosphor-composite according to any of (9) to (12), wherein the sintered phosphor-composite has a transmittance of 20% or more at a wavelength of 700 nm.

(14) The sintered phosphor-composite according to any of (9) to (13), wherein the sintered phosphor-composite has an internal quantum efficiency of 60% or more when being excited by blue light having a wavelength of 450 nm.

(15) A sintered phosphor-composite including: at least one phosphor of nitride phosphors selected from the group consisting of CASN represented by the following general formula: $CaASiN_3$:Eu, SCASN represented by the following general formulae: $(Ca, Sr, Ba, Mg)AlSiN_3$:Eu and/or $(Ca Sr, Ba)AlSiN_{3-x}O_x$:Eu (0<x<3), $Sr_2Si_5N_8$ represented by the following general formula: $(Sr, Ca, Ba)_2Al_xSi_{5-x}O_xN_{8-x}$:Eu (0≤x≤2 in the formula), LSN represented by the following general formula: $Ln_xSi_yN_n$:Z (wherein Ln is a rare-earth element except an element used as an activator: Z is the activator; and 2.7≤x≤3.3, 5.4≤y≤6.6, and 10≤n≤12 are satisfied), and β-sialon represented by the following general formula: $Si_{6-z}Al_zO_zN_{8-z}$:Eu (0<z<4.2 in the formula); and a fluoride inorganic binder that is a cubic crystal, wherein the sintered phosphor-composite has a transmittance of 20% or more at a wavelength of 700 nm; and the sintered phosphor-composite has an internal quantum efficiency of 60% or more when being excited by blue light having a wavelength of 450 nm.

(16) A sintered phosphor-composite including: a garnet-based phosphor that emits yellow or red light; a nitride phosphor that emits red light; and a fluoride inorganic binder.

(17) The sintered phosphor-composite according to (16), wherein the sintered phosphor-composite has a transmittance of 20% or more at a wavelength of 700 nm.

(18) The sintered phosphor-composite according to (16) or (17), wherein the sintered phosphor-composite has an internal quantum efficiency of 60% or more when being excited by blue light having a wavelength of 450 nm.

Effects of the Invention

In accordance with the present invention, there can be provided a sintered phosphor-composite for an LED with high heat resistance, high thermal conductivity, high luminance, and high conversion efficacy. In addition, a light-emitting apparatus with a low brightness variation and a small color deviation due to variations in excitation light intensity and temperature as well as an illumination apparatus and a vehicular headlamp using the light-emitting apparatus can be provided by using the sintered phosphor-composite.

DESCRIPTION OF EMBODIMENTS

<1. Sintered Phosphor-Composite>

Figure 1:
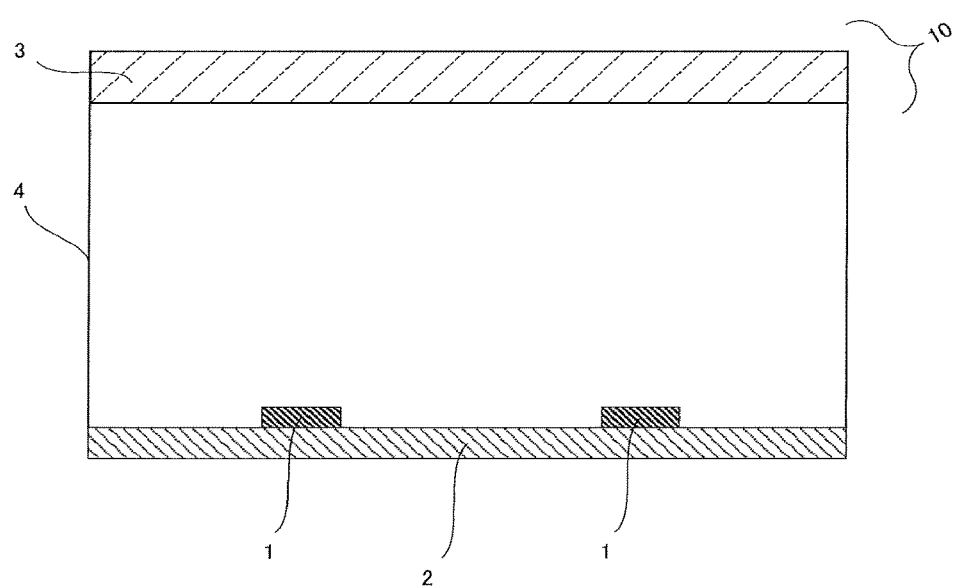
FIG. 1 is a schematic view illustrating a configuration example of a semiconductor light-emitting apparatus according to an aspect of the present invention.

A sintered phosphor-composite according to an embodiment of the present invention is a sintered phosphor-composite including a nitride phosphor and a fluoride inorganic binder. The fluoride inorganic binder used has at least heat resistance and preferably has a high thermal conductivity.

(Morphology of Sintered Phosphor-Composite)

In the present specification, the sintered phosphor-composite is not particularly restricted, particularly as long as being a composite including a nitride phosphor and a fluoride inorganic binder, but is preferably a composite in which a nitride phosphor and a fluoride inorganic binder are integrated by physical and/or chemical bonds in a state in which the nitride phosphor is distributed in the fluoride inorganic binder. By combining a nitride and a fluoride of which the ionic radii are different, the reaction of the nitride phosphor and the fluoride inorganic binder in sintering is suppressed, whereby the sintered phosphor-composite having a high internal quantum efficiency can be obtained.

The morphology of such a sintered phosphor-composite can be observed by an observation method such as observation of the surface of the sintered phosphor-composite with a scanning electron microscope or observation of a cross section of the sintered phosphor-composite with a scanning electron microscope after cutting the sintered phosphor-composite to cut out the cross section or after generating the cross section of the sintered phosphor-composite by a cross section polisher.

<1-1. Nitride Phosphor>

Examples of techniques for confirming the presence of a nitride phosphor in the sintered phosphor-composite according to the embodiment of the present invention include identification of a nitride phosphor phase by X-ray diffraction, observation and elemental analysis of a particle structure with an electron microscope, and elemental analysis by fluorescent X-rays.

A nitride phosphor has at least a feature of absorbing excitation light emitted from a light-emitting element, converting the wavelength of the light, and emitting light having a wavelength different from the wavelength of the light from the light-emitting element. The kind of the nitride phosphor is not particularly limited as long as the nitride phosphor is a phosphor including nitrogen in phosphor composition, and examples thereof include nitride phosphors including strontium and silicon in the crystal phases thereof (specifically, SCASN and $Sr_2Si_5N_8$), nitride phosphors including calcium and silicon in the crystal phases thereof (specifically, SCASN, CASN, and CASON), nitride phosphors including strontium, silicon, and aluminum in the crystal phases thereof (specifically, SCASN and $Sr_2Si_5N_8$), and nitride phosphors including calcium, silicon, and aluminum in the crystal phases thereof (specifically, SCASN, CASN, and CASON).

In addition, specific examples thereof include phosphors such as:

β-sialon that can be represented by the following general formula: $Si_{6-z}Al_zO_zN_{8-z}$:Eu (0<z<4.2 in the formula), α-sialon;

LSN represented by the following general formula: $Ln_x$-$Si_yN_n$:Z (wherein Ln is a rare-earth element except an element used as an activator; Z is the activator; and 2.7≤x≤3.3, 5.4≤y≤6.6, and 10≤n≤12 are satisfied):

CASN represented by the following general formula: $CaAlSiN_3$:Eu;

SCASN that can be represented by the following general formulae: (Ca, Sr, Ba, Mg)$AlSiN_3$:Eu and/or (Ca, Sr, Ba)$AlSiN_{3-x}O_x$:EU (0<x<3);

CASON that can be represented by the following general formula: $(CaAlSiN_3)_{1-x}(Si_2NO)_x$:Eu (0<x<0.5 in the formula);

$CaAlSi_4N_7$ that can be represented by the following general formula: $Eu_y$(Sr, Ca, Ba)$_{1-y}$:$Al_{1+x}Si_{4-x}O_xN_{7-x}$ (0≤x<4 and 0<y<0.2 in the formula); and $Sr_2Si_5N_8$ that can be represented by the following general formula: (Sr, Ca, Ba)$_2Al_xSi_{5-x}O_xN_{8-x}$:Eu (0≤x≤2 in the formula).

Among these phosphors, it is preferable to use nitride phosphors that do not include oxygen, i.e., nitride phosphors such as LSN, CASN, SCASN, $Sr_2Si_5N_8$, and β-sialon from the viewpoint of preventing luminance from decreasing when the sintered phosphor-composite is made.

In the composition formula of the LSN phosphor described above, the above-described Ln is preferably a rare-earth element including 80 mol % or more of La, more preferably a rare earth element including 95 mol % or more of La, and still more preferably La. It is considered that rare-earth elements can be used as elements, except La, included in Ln without any problem. Preferred examples of the elements include yttrium and gadolinium which are also often substituted in the case of other phosphors. These elements are preferred because the ionic radii of the elements are close to each other and the charges of the elements are also equal to each other.

The activator Z preferably includes either Eu or Ce, more preferably includes 80 mol % or more of Ce, still more preferably includes 95 mol % or more of Ce, and is most preferably Ce.

The molar ratio of the elements, i.e., the ratio of x, y, and z is 3:6:11 as a stoichiometric composition, a phosphor can be used even in a case in which the margin of the ratio is plus or minus around 10%, and therefore, the values of x, y, and z are set in the ranges of $2.7 \leq x \leq 3.3$, $5.4 \leq y \leq 6.6$, and $10 \leq n \leq 12$, respectively.

The nitride phosphor used in the present embodiment may be a nitride phosphor in which some sites are substituted by an alkaline-earth metal element such as calcium or strontium, aluminum, or the like for the purpose of, e.g., changing a chromaticity point, and such nitride phosphors are not excluded from the scope of the present invention. For example, substitutions with calcium, yttrium, gadolinium, and strontium may be used for prolonging emission wavelengths, and can be preferably described as examples. Because these elements satisfy the principle of conservation of charge, the substitutions with the elements occur simultaneously with other elements. As a result, some of the sites of Si and N may be substituted with oxygen, and such phosphors may also be preferably used.

Because the refractive index of the nitride phosphor is higher than those of other phosphors, it is preferable to form a special water film on a surface of the phosphor. A technology for forming a special water film on a surface of a nitride phosphor will be described later, and International Publication No. WO 2013/073598 can be referred to for the technology. When the special water film is disposed on the surface of the nitride phosphor, it is preferable to perform coating or surface treatment such that the number of hydroxyl groups on the surface is increased.

The nitride phosphor may include oxygen atoms; however, since the excessively high rate of the oxygen atoms in the nitride phosphor may result in a decrease in the luminance of the sintered phosphor-composite, the mass rate of the oxygen atoms in the nitride phosphor is preferably 25% or less, more preferably 10% or less, still more preferably 5.0% or less, even more preferably 3.0% or less, and particularly preferably 1.0% or less in the case of excluding oxygen derived from adsorbed moisture.

(Particle Diameter of Nitride Phosphor)

The volume median diameter of the nitride phosphor is in the range of typically 0.1 μm or more and preferably 0.5 μm or more, and typically 35 μm or less and preferably 25 μm or less. The above-described range can result in suppression of a decrease in luminance and in suppression of aggregation of phosphor particles. The volume median diameter can be measured by, for example, a Coulter counter method, and can be measured using, as a representative apparatus, e.g., "MULTISIZER" from Beckman Coulter, Inc.

(Volume Fraction of Nitride Phosphor)

The volume fraction of the nitride phosphor with respect to the total volume of the sintered phosphor-composite is typically 1% or more and 50% or less. This is because the excessively low volume fraction of the nitride phosphor makes it impossible to perform sufficient wavelength conversion while the excessively high volume fraction may cause wavelength conversion efficacy to be deteriorated.

(Surface Layer of Nitride Phosphor in Sintered Phosphor-Composite)

A surface of the nitride phosphor in the sintered phosphor-composite, in which an oxygen atom-containing layer having a composition different from the compositions of the phosphor and the inorganic binder is formed, can also be used. The oxygen atom-containing layer is formed by, e.g., the adsorption of moisture on the surface of the nitride phosphor, and the thickness of the oxygen atom-containing layer is typically 5 nm or more and 500 nm or less, preferably 10 nm or more and 400 nm or less, and more preferably 20 nm or more and 300 nm or less. The oxygen atom-containing layer on the nitride phosphor surface, having a thickness far smaller than this range, makes it impossible to prevent the internal quantum efficiency of the phosphor from deteriorating when the sintered phosphor-composite is formed, while the excessively thick oxygen atom-containing layer tends to cause light-transmitting properties to be impaired. The oxygen atom-containing layer can be measured by an infrared absorption spectrum, temperature programmed desorption mass spectrometry, time-of-flight secondary ion mass spectrometry (TOF-SIMS), photoelectron spectroscopy (XPS), or an observation method such as observation of the surface of the sintered composite with a scanning electron microscope or observation of a cross section of the sintered composite with a scanning electron microscope after cutting a sintered composite to cut out the cross section or after generating the cross section of the sintered composite by a cross section polisher.

(Step of Surface Treatment of Nitride Phosphor)

International Publication No. WO 2013/073598 can be referred to for a method for forming the layer containing oxygen atoms by, e.g., the adsorption of moisture on the surface of the nitride phosphor, and examples of the method include methods for performing surface treatment. Means for performing surface treatment of the nitride phosphor is not particularly restricted, but examples thereof include a vapor heat treatment method, a sol-gel method, a sputtering method, a chemical vapor deposition (CVD) method, a vapor deposition method, an ozone treatment method, a plasma treatment method, and a corona treatment method. Among them, a vapor heat treatment method is preferably used. The heat treatment method described above will be described below.

(Vapor Heat Treatment Step)

The above-described heat method includes the heat treatment step described above, and can be obtained by vapor heat treatment of the nitride phosphor produced through usual steps and left standing in the presence of vapor, and preferably in the presence of water vapor.

When adsorbed water is allowed to be present on the surface of the nitride phosphor by putting the nitride phosphor in the presence of vapor, the temperature of the vapor is typically 50° C. or more, preferably 80° C. or more, and more preferably 100° C. or more, and typically 400° C. or less, preferably 300° C. or less, and more preferably 200° C. or less. The excessively low temperature tends to preclude an effect caused by the presence of the adsorbed water on the nitride phosphor surface while the excessively high temperature may cause the surfaces of nitride phosphor particles to be roughened.

A humidity (relative humidity) is typically 50% or more, preferably 80% or more, and particularly preferably 100%. The excessively low humidity tends to preclude the effect caused by the presence of the adsorbed water on the nitride phosphor surface. A liquid phase may coexist in a vapor phase having a humidity of 100% as long as the effect of the formation of an adsorbed water layer can be obtained.

In addition, a pressure is typically not less than an ordinary pressure, preferably 0.12 MPa or more, and more preferably 0.3 MPa or more, and typically 10 MPa or less, preferably 1 MPa or less, and more preferably 0.5 MPa or less. The excessively low pressure tends to preclude the effect caused by the presence of the adsorbed water on the nitride phosphor surface while the excessively high pressure may result in a large treatment apparatus and may cause a safety problem in working.

A time for which the nitride phosphor is retained in the presence of vapor varies depending on the temperature, the humidity, and the pressure, and the retention time may be typically shortened with increasing the temperature, with increasing the humidity, or with increasing the pressure. The specific range of the time is typically 0.5 hours or more, preferably 1 hour or more, and more preferably 1.5 hours or more, and typically 200 hours or less, preferably 100 hours or less, more preferably 12 hours or less, and still more preferably 5 hours or less.

Specific examples of a method for performing a vapor heating step while satisfying the conditions described above include a method under high humidity and high pressure in an autoclave. In such a case, an apparatus, such as a pressure cooker, that can be allowed to be under the conditions of high temperature and high humidity to extents similar to the extents of an autoclave may be used in addition to the autoclave or instead of using the autoclave. Examples of pressure cookers that can be used include TPC-412M (manufactured by ESPEC CORP.), which can control a temperature to 105° C. to 162.2° C., a humidity to 75 to 100% (varying according to a temperature condition), and a pressure to 0.020 MPa to 0.392 MPa (0.2 kg/cm$^2$ to 4.0 kg/cm$^2$).

By performing the vapor heating step while retaining the nitride phosphor in the autoclave, a special water layer can be formed in an environment having a high temperature, a high pressure, and a high humidity, and therefore, adsorbed water can be allowed to be present on the nitride phosphor surface particularly in a short time. Specific preferred conditions are as follows: the pressure is not less than an ordinary pressure (0.1 MPa); and the nitride phosphor is put for 0.5 hours or more under an environment in which vapor is present. Preferably, the phosphor is put in, for example, a container that is made of alumina, is porcelain, or the like, and then put in the autoclave. In this case, the phosphor may be subjected to a step such as acid washing, classification, or surface treatment in advance, or the effect can be obtained even by using the burnt phosphor on an as-is basis.

(Method for Producing Nitride Phosphor)

The nitride phosphor used in the present embodiment is any of known phosphors, each of the phosphors can be produced by known methods, and therefore, descriptions thereof are omitted herein.

<1-2. Fluoride Inorganic Binder>

(Fluoride Inorganic Binder and Fluoride Inorganic Binder Particles)

Examples of techniques for confirming the presence of a fluoride inorganic binder in the sintered phosphor-composite according to the embodiment of the present invention include identification of an inorganic binder phase by X-ray diffraction, observation and elemental analysis of a surface or cross-section structure of a sintered composite with an electron microscope, and elemental analysis by fluorescent X-rays.

The total volume fraction of the nitride phosphor and the fluoride inorganic binder with respect to the total volumes of the sintered phosphor-composite is preferably 80% or more, still more preferably 90% or more, and particularly preferably 95% or more. This is because the low total volume fraction makes it impossible to exhibit the effects of the present invention.

The volume fraction of the fluoride inorganic binder with respect to the total volume of the nitride phosphor and the fluoride inorganic binder is typically 50% or more, preferably 60% or more, and more preferably 70% or more, and typically 99% or less, preferably 98% or less, and more preferably 97% or less.

In the present embodiment, the fluoride inorganic binder is used as a matrix in which the nitride phosphor is dispersed. It is preferable that the fluoride inorganic binder transmits part of excitation light emitted from a light-emitting element or at least part of light emitted from the nitride phosphor. For efficiently extracting light emitted from the nitride phosphor, it is preferable that the refractive index of the fluoride inorganic binder is close to the refractive index of the phosphor. Further, it is preferable to endure heat generated by irradiation with strong excitation light and to have heat dissipation properties. In addition, the use of the fluoride inorganic binder results in the favorable moldability of the sintered phosphor-composite.

Specific examples of the fluoride inorganic binder include any one or more selected from the group consisting of $CaF_2$ (calcium fluoride), $MgF_2$ (magnesium fluoride), $BaF_2$ (barium fluoride). $SrF_2$ (strontium fluoride), $LaF_3$ (lanthanum fluoride), and the like, and composites thereof.

The fluoride inorganic binder is composed by physically and/or chemically binding particles having the same composition as that of the fluoride inorganic binder.

(Physical Properties of Fluoride Inorganic Binder Particles)

Particle Diameter

The volume median diameter of the fluoride inorganic binder particles is typically 0.01 μm or more, preferably 0.02 μm or more, more preferably 0.03 μm or more, and particularly preferably 0.05 μm or more, and typically 15 μm or less, preferably 10 μm or less, more preferably 5 μm or less, still more preferably 3 μm or less, and particularly preferably 2 μm or less. By allowing the fluoride inorganic binder particles to have the range described above, a sintering temperature can be reduced, deactivation of the nitride phosphor caused by the reaction of the nitride phosphor and the inorganic binder can be suppressed, and a reduction in the internal quantum efficiency of the sintered phosphor-composite can be suppressed. The volume median diameter can be measured by, for example, the Coulter counter method described above, or is measured by another apparatus of which representative examples include laser diffraction particle size distribution measurement, a scanning electron microscope (SEM), a transmission electron microscope (TEM), and "MULTISIZER" from Beckman Coulter, Inc.

Purity

Examples of techniques for confirming the purity of the fluoride inorganic binder particles include elemental analysis by ICP-AES, and element determination analysis by the fluorescent X-rays.

The purity of the fluoride inorganic binder particles is typically 99% or more, preferably 99.5% or more, and more preferably 99.9% or more. When the purity is low, a foreign substance with a black color or the like tends to be generated after sintering, thereby deteriorating light-transmitting properties and luminous efficacy. Therefore, the above-described range is preferred.

Refractive Index

Examples of techniques for confirming the refractive index of the fluoride inorganic binder particles include methods of subjecting sintered bodies including fluoride inorganic binder particles to mirror polishing and performing measurement thereof by a minimum deviation angle method, a critical angle method, and a V-block method using the sintered bodies.

The ratio nb/np of the refractive index nb of the fluoride inorganic binder particles to the refractive index np of the nitride phosphor is 1 or less, preferably 0.8 or less, and more preferably 0.6 or less. When the refractive index ratio is more than 1, light extraction efficiency tends to be reduced after sintering. Therefore, the above-described range is preferred.

Thermal Conductivity

Examples of techniques for confirming the thermal conductivity of the fluoride inorganic binder particles include methods of producing a sintered composite including fluoride inorganic binder particles and performing measurement thereof by a steady heating method, a laser flash method, and a periodic heating method using the sintered composite.

The thermal conductivity of the fluoride inorganic binder particles is typically 3.0 W/(m·K) or more, preferably 5.0 W/(m·K) or more, and more preferably 10 W/(m·K) or more. When the thermal conductivity is less than 3.0 W/(m·K), strong excitation light irradiation may cause the temperature of the sintered phosphor-composite to be increased and tends to degrade the phosphor and surrounding members. Therefore, the above-described range is preferred.

Melting Point

It is preferable that the melting point of the fluoride inorganic binder particles is low. By using the fluoride inorganic binder particles having the low melting point, a sintering temperature can be reduced, deactivation of the nitride phosphor caused by the reaction of the nitride phosphor and the inorganic binder can be suppressed, and a reduction in the internal quantum efficiency of the sintered phosphor-composite can be suppressed. Specifically, the melting point is preferably 1500° C. or less, and more preferably 1300° C. or less. The lower limit of the temperature is not particularly limited, but is typically 500° C. or more.

Crystal System

It is preferable that the crystal system of the fluoride inorganic binder particles is a cubic system. Because the fluoride inorganic binder particles have the cubic system, the sintered phosphor-composite into which the fluoride inorganic binder particles are made has high transparency, thereby improving light extraction efficiency.

Solubility

The fluoride inorganic binder particles preferably have a solubility of 0.05 g or less per 100 g of water at 20° C.

<1-3. Garnet-Based Phosphor that Emits Yellow or Green Light>

The sintered phosphor-composite according to another embodiment of the present invention includes a garnet-based phosphor that emits yellow or green light, a nitride phosphor that emits red light, and a fluoride inorganic binder.

Examples of the nitride phosphor that emits red light include phosphors such as:

already described CASN represented by the following general formula: $CaAlSiN_3$:Eu;

SCASN that can be represented by the following general formulae: $(Ca, Sr, Ba, Mg)AlSiN_3$:Eu and/or $(Ca, Sr, Ba)AlSiN_{3-x}O_x$:Eu (0<x<3 in the formula);

CASON that can be represented by the following general formula: $(CaASiN_3)_{1-x}(Si_2N_2O)_x$:Eu (0<x<0.5 in the formula);

$CaAlSi_4N_7$ that can be represented by the following general formula: $Eu_y(Sr, Ca, Ba)_{1-y}:Al_{1+x}Si_{4-x}O_xN_{7-x}$ (0≤x<4 and 0<y<0.2); and $Sr_2Si_5N_8$ that can be represented by the following general formula: $(Sr, Ca, Ba)_2Al_xSi_{5-x}O_xN_{8-x}$:Eu (0≤x<2 in the formula).

Examples of the garnet-based phosphor that emits yellow or green light include a YAG phosphor represented by the following general formula (1), a GYAG phosphor represented by the general formula (2), an LuAG phosphor represented by the general formula (3), and a phosphor represented by the general formula (4):

$$Y_a(Tb,Lu)_b(Ga,Sc)_cAl_dO_e:Ce \quad (1)$$

(a+b=3, 0≤b≤0.2, 4.5≤c+d≤5.5, 0≤c≤0.2, and 10.8≤e≤13.4 in the formula (1));

$$Y_a(Tb,Gd,Lu)_b(Ga,Sc)_cAl_dO_e:Ce \quad (2)$$

(a+b=3, 0≤b≤0.2, 4.5≤c+d≤5.5, 1.2≤c≤2.6, and 10.8≤e≤13.4);

$$Lu_a(Tb,Gd,Y)_b(Ga,Sc)_cAl_dO_e:Ce \quad (3)$$

(a+b=3, 0≤c≤0.2, 4.5≤c+d≤5.5, 0≤d≤0.2, and 10.8≤e≤13.4; and $$Y_aTb_f(Gd,Lu)_b(Ga,Sc)_cAl_dO_e:Ce \quad (4)$$

(a+b+f=3, 0≤b≤0.2, 4.5≤c+d≤5.5, 0≤c≤2.6, 10.8≤e≤13.4, and 0.1≤f≤1).

In the present embodiment, the blending ratios of the garnet-based phosphor that emits yellow or green light and the nitride phosphor that emits red light can be adjusted as appropriate according to the demanded color temperature and color rendering properties of light, but each thereof is typically 0.5% or more and preferably 1.0% or more, and typically 20% or less and preferably 10% or less with respect to total volume of the sintered phosphor-composite.

<1-4. Method for Producing Sintered Phosphor-Composite>

By using the nitride phosphor and fluoride inorganic binder particles described above, or the garnet-based phosphor, nitride phosphor, and fluoride inorganic binder particles described above as principal raw materials, and compacting/sintering a mixture thereof, a sintered phosphor-composite which is a composite of the above-described materials can be produced. However, a production method is not particularly restricted. A more preferred production method will be described below.

Specifically, the following (step 1) to (step 2) are described as examples.

(Step 1) Step of stirring/mixing a nitride phosphor (or a garnet-based phosphor and a nitride phosphor) and inorganic binder particles, performing pressurization pressing-molding of the resultant, and sintering the molded body (Step 2) Step of stirring/mixing a nitride phosphor (or a garnet-based phosphor and a nitride phosphor) and inorganic binder particles and sintering the resultant simultaneously with pressurization pressing.

(Step 1)

Stirring/Mixing Step

First, a nitride phosphor (or a garnet-based phosphor and a nitride phosphor) and inorganic binder particles are mixed to obtain a mixed powder of the nitride phosphor or the like (hereinafter, a nitride phosphor that may include a garnet-based phosphor is referred to as a nitride phosphor or the like) and the inorganic binder particles. Assuming that the total of a sintered composite including the nitride phosphor or the like and the inorganic binder particles is 100%, the mixing is performed so that the volume fraction of the fluoride inorganic binder is typically 50% or more, preferably 60% or more, and more preferably 70% or more, and typically 99% or less, preferably 98% or less, and more preferably 97% or less. Examples of methods for stirring/mixing them include dry mixing methods with a ball mill, a V-blender, and the like, and wet mixing methods of adding a solvent to a nitride phosphor or the like and an inorganic binder to be in a slurry state and using a ball mill, a homogenizer, an ultrasonic homogenizer, a biaxial kneading machine, and the like. A stirring/mixing time is typically 0.5 hours or more, preferably 2 hours or more, and more preferably 6 hours or more, and typically 72 hours or less, preferably 48 hours or less, and more preferably 24 hours or less. Overall homogeneous mixing is enabled by mechanical stirring/mixing in such a manner.

An organic binder, a dispersant, and in addition, a solvent may be added in order to improve moldability in the pressurization pressing. When the organic binder and the like are added, typically 0.1% by weight or more and 5% by weight or less of the organic binder, typically 0.01% by weight or more and 3% by weight or less of the dispersant, and typically 10% by weight or more and 70% by weight or less of the solvent are mixed to produce slurry, for example, assuming that the total of the sintered composite is 100% by weight. In this case, polyvinyl alcohol, polyacrylic acid, polyvinyl butyral, methyl cellulose, starch, or the like can be used as the organic binder. Stearic acid, sodium dodecyl-benzenesulfonate, ammonium polycarboxylate, or the like can be used as the dispersant. Water, methyl alcohol, ethyl alcohol, isopropyl alcohol, or the like can be used as the solvent. They may be used alone or in admixture thereof.

Examples of methods for mixing them include wet mixing methods using a ball mill, a homogenizer, an ultrasonic homogenizer, a biaxial kneading machine, and the like. When the organic binder and the like are added, a stirring/mixing time is typically 0.5 hours or more, preferably 2 hours or more, and more preferably 6 hours or more, and typically 72 hours or less, preferably 48 hours or less, and more preferably 24 hours or less. Overall homogeneous mixing is enabled by mechanical stirring/mixing in such a manner. Inorganic binder particles coated with an organic binder may also be mixed with the phosphor.

In the case of wet mixing, a solvent-drying/granulation step is performed subsequently to the stirring/mixed step. In the solvent-drying/granulation step, a solvent in the slurry obtained in the stirring/mixing step is volatilized at a predetermined temperature to obtain a mixed powder of the nitride phosphor, the inorganic binder particles, and the organic binder. Alternatively, granules having a predetermined particle diameter may be produced by using a known spray drying apparatus (spray dryer apparatus). The average particle diameter of the granules is typically 22 μm or more, preferably 24 μm or more, and more preferably 26 μm or more, and typically 200 μm or less, preferably 150 μm or less, and more preferably 100 μm or less. A small granule diameter results in a small bulk density and precludes a powder handling ability and filling into a press die, while a large granule diameter causes pores to remain in a pressed molded body, thereby leading to the reduction of a sintering degree.

Molding Step

In this step, the mixed powder obtained in the stirring/mixing step is pressing-molded using uniaxial die molding and cold isostatic pressing (CIP) to obtain a green body having a geometry of interest. A pressure in the molding is typically 1 MPa or more, preferably 5 MPa or more, and more preferably 10 MPa or more, and typically 1000 MPa or less, preferably 800 MPa or less, and more preferably 600 MPa or less. The excessively low pressure in the molding makes it impossible to obtain a molded body, while the excessively high pressure causes the phosphor to be mechanically damaged, thereby deteriorating luminescence properties.

Degreasing Step

Degreasing in which an organic binder component is burnt and removed, in air, from the green body molded using the organic binder is performed as needed. A furnace used in the degreasing is not particularly limited as long as a desired temperature and pressure can be achieved. Restrictions are not particularly imposed as long as the above-described requirements are satisfied, but for example, a shuttle furnace, a tunnel furnace, a lead hammer furnace, a rotary kiln, a reaction vessel such as an autoclave, a Tammann-furnace, an Acheson furnace, a hot press apparatus, a pulse-current pressure sintering apparatus, a hot isostatic pressing sintering apparatus, a pressurized atmosphere furnace, a heating process furnace, a high-frequency induction heating furnace, direct resistance heating, indirect resistance heating, direct combustion heating, radiant heating, electric heating, and the like can be used. In the treatment, stirring may also be performed as needed.

An atmosphere in the degreasing treatment is not particularly limited, but it is preferable to perform the degreasing treatment in atmospheric air or under atmospheric air flow. A degreasing treatment temperature is typically 300° C. or more, preferably 400° C. or more, and more preferably 500° C. or more, and typically 1200° C. or less, preferably 1100° C. or less, and more preferably 1000° C. or less although the appropriate range of the temperature varies according to inorganic binders used.

A degreasing treatment time is typically 0.5 hours or more, preferably 1 hour or more, and more preferably 2 hours or more, and typically 6 hours or less, preferably 5 hours or less, and more preferably 4 hours or less. The treatment temperature and time that are less than these ranges tend to make it impossible to sufficiently remove an organic component, while the treatment temperature and time that are more than the ranges tend to result in degradation, such as oxidation, of a surface of the phosphor and to cause luminescence properties to be deteriorated.

In the degreasing step, a heat history temperature condition, a temperature-raising rate, a cooling rate, a heat treatment time, and the like can be set as appropriate. The temperature may be raised to a predetermined temperature after heat treatment in a relatively low temperature region. Examples of a reaction machine used in this step may include batch- or continuous-type and single or plural reaction machines.

Sintering Step

A sintered phosphor-composite is obtained by sintering the molded body obtained through the molding step and/or the degreasing step. A step used in the sintering is not particularly limited as long as a desired temperature and pressure can be achieved. For example, a shuttle furnace, a tunnel furnace, a lead hammer furnace, a rotary kiln, a reaction vessel such as an autoclave, a Tammann-furnace, an Acheson furnace, a hot press apparatus, a pulse-current pressure sintering apparatus, a hot isostatic pressing sintering apparatus, a pressurized atmosphere furnace, a heating process furnace, a high-frequency induction heating furnace, direct resistance heating, indirect resistance heating, direct combustion heating, radiant heating, electric heating, and the like can be used. In the treatment, stirring may also be performed as needed. An atmosphere in which sintering treatment is performed is not particularly limited, but it is preferable to perform the sintering treatment under an air atmosphere, under a $N_2$ atmosphere, under an Ar atmosphere, or under a vacuum, or under atmospheric air flow, under $N_2$ flow, under Ar flow, under atmospheric air pressurization, under $N_2$ pressurization, or under Ar pressurization. $H_2$ may also be introduced into an atmosphere gas as appropriate. A sintering treatment temperature is typically 300° C. or more, preferably 400° C. or more, and more preferably 500° C. or more, and typically 1900° C. or less, preferably 1500° C. or less, more preferably 1300° C. or less, and still more preferably 1000° C. or less although the optimum range of the temperature varies according to an inorganic binder used. In addition, the sintering temperature is a temperature that is lower than the melting point of a fluoride inorganic binder used, by typically 50° C. or more, preferably 100° C. or more, and more preferably 150° C. or more. The melting point of calcium fluoride ($CaF_2$) is 1418° C., and the melting point of strontium fluoride ($SrF_2$) is 1477° C. The sintering treatment may be performed in an atmosphere under pressurization, and in such a case, the pressurized atmosphere may be 0.05 MPa, preferably 0.1 MPa or more, and more preferably 0.5 MPa or more.

A sintering treatment time is typically 0.1 hours or more, preferably 0.5 hours or more, and more preferably 1 hour or more, and typically 6 hours or less, preferably 5 hours or less, and more preferably 4 hours or less. The treatment temperature and time that are less than these ranges make it impossible to sufficiently remove an organic component, while the treatment temperature and time that are more than the ranges result in degradation, such as oxidation, of a surface of the phosphor and to cause luminescence properties to be deteriorated.

In the sintering step, a heat history temperature condition, a temperature-raising rate, a cooling rate, a heat treatment time, and the like are set as appropriate. The temperature may be raised to a predetermined temperature after heat treatment in a relatively low temperature region. Examples of a reaction machine used in this step may include batch- or continuous-type and single or plural reaction machines.

The molded body obtained in the sintering step once may be further sintered. A step used in the sintering is not particularly restricted, but examples in the step include a hot isostatic pressing sintering apparatus.

In the sintering step, a sintering aid may be used as appropriate. The sintering aid used in the sintering step is not particularly restricted, but examples thereof include MgO, $Y_2O_3$, CaO, $Li_2O$, BaO, $La_2O_3$, $Sm_2O_3$, $Sc_2O_3$, $ZrO_2$, $SiO_2$, $MgAl_2O_4$, LiF, NaF, BN, AlN, $Si_3N_4$, Mg, Zn, Ni, W, $ZrB_2$, $H_2$, Ti, and Mn, which may be used in admixture of two or more kinds thereof.

(Step 2)
Stirring/Mixing Step

A stirring/mixing step can be performed in a manner similar to that of the stirring/mixing step of the step 1.

Pressurization Pressing-Sintering Step

A sintered phosphor-composite is obtained by heating a mixed powder of a nitride phosphor and the like and inorganic binder particles, obtained in the stirring/mixing step, while pressurizing the powder. A furnace used in the pressurization pressing-sintering is not particularly limited as long as a desired temperature and pressure can be achieved. For example, a hot press apparatus, a pulse-current pressure sintering apparatus, a hot isostatic pressing sintering apparatus, also a heating process, a high-frequency induction heating furnace, direct resistance heating, indirect resistance heating, direct combustion heating, radiant heating, electric heating, and the like can be used. An atmosphere in which pressurization pressing-sintering treatment is performed is not particularly limited, but it is preferable to perform the pressurization pressing-sintering treatment under an air atmosphere, under a $N_2$ atmosphere, under an Ar atmosphere, or under a vacuum, or under atmospheric air flow, under $N_2$ flow, under Ar flow, under atmospheric air pressurization, under $N_2$ pressurization, or under Ar pressurization. $H_2$ may also be introduced into an atmosphere gas as appropriate. A sintering treatment temperature is typically 300° C. or more, preferably 400° C. or more, and more preferably 500° C. or more, and typically 1900° C. or less, preferably 1500° C. or less, more preferably 1300° C. or less, and still more preferably 1000° C. or less although the optimum range of the temperature varies according to an inorganic binder used. In addition, the sintering temperature may be a temperature that is lower than the melting point of a fluoride inorganic binder used, by 50° C. or more, preferably 100° C. or more, and more preferably 150° C. or more. The melting point of calcium fluoride ($CaF_2$) is 1418° C., and the melting point of strontium fluoride ($SrF_2$) is 1477° C.

A sintering treatment time is typically 0.1 hours or more, preferably 0.5 hours or more, and more preferably 1 hour or more, and typically 6 hours or less, preferably 5 hours or less, and more preferably 4 hours or less.

A pressurization press pressure is typically 1 MPa or more, preferably 5 MPa or more, and more preferably 10 MPa or more, and typically 1000 MPa, preferably 800 MPa or less, and more preferably 600 MPa or less. The excessively low pressure in the molding makes it impossible to obtain a molded body, while the excessively high pressure may cause the phosphor to be mechanically damaged and luminescence properties to be deteriorated.

In the pressurization pressing-sintering step, a heat history temperature condition, a temperature-raising rate, a cooling rate, a heat treatment time, and the like are set as appropriate. The temperature may be raised to a predetermined temperature after heat treatment in a relatively low temperature region. Examples of a reaction machine used in this step may include batch- or continuous-type and single or plural reaction machines.

In the sintering step, a sintering aid may be used as appropriate. The sintering aid used in the sintering step is not particularly restricted, but examples thereof include MgO, $Y_2O_3$, CaO, $Li_2O$, BaO, $La_2O_3$, $Sm_2O_3$, $Sc_2O_3$, $ZrO_2$, $SiO_2$, $MgAl_2O_4$, LiF, NaF, BN, AlN, $Si_3N_4$, Mg, Zn, Ni, W, $ZrB_2$, $H_2$, Ti, and Mn, which may be used in admixture of two or more kinds thereof.

<2. Sintered Phosphor-Composite>

The obtained sintered phosphor-composite may be used on an as-is basis or may be usually sliced to have a predetermined thickness and further worked to have a plate shape having a predetermined thickness by grinding and polishing, thereby obtaining a plate-shaped sintered phosphor-composite. Grinding/polishing conditions are not particularly limited, but for example, the phosphor is polished with a diamond grindstone of #800 at a grindstone rotation number of 80 rpm, a workpiece rotation number of 80 rpm, and 50 g/cm² and worked to have a plate shape. The lower limit of the thickness of the final sintered phosphor-composite is typically 30 μm or more, preferably 50 μm or more, and more preferably 100 μm or more, and the upper limit thereof is typically 2000 μm or less, preferably 1000 μm or less, still more preferably 800 μm or less, and more preferably 500 μm or less. The sintered phosphor-composite plate is prone to be broken when the thickness of the sintered phosphor-composite plate is not more than the range. In contrast, the sintered phosphor-composite plate is resistant to light transmission when the thickness is more than the range.

Further, a surface thereof may be polished as appropriate, followed by performing microbumping on the surface by wet etching treatment, dry wet etching treatment, or the like as appropriate.

(Physical Properties of Sintered Phosphor-Composite)

The sintered phosphor-composite according to the present embodiment (including a plate-shaped sintered phosphor-composite; the same applies hereafter) possesses the following properties.

Sintering Degree

In a technique for confirming the sintering degree of the sintered phosphor-composite of the present invention, a density $\rho_a$ is measured by an Archimedes method, and the sintering degree is calculated from $\rho_a/\rho_{theoretical} \times 100$ by using the theoretical density $\rho_{theoretical}$ of the sintered composite.

The theoretical density is a density based on the assumption that atoms in a material are ideally arranged.

The sintering degree of the sintered phosphor-composite is typically 90% or more, preferably 95% or more, and more preferably 99% or more. When the sintering degree is in this range, the number of cavities (voids) existing in the sintered phosphor-composite is reduced, and a light transmittance and light extraction efficiency (conversion efficacy) are improved. In contrast, when the sintering degree is not more than the range, light is highly scattered, and light extraction efficiency is deteriorated. Therefore, the above-described range is preferred.

The sintering degree of the sintered phosphor-composite can be allowed to be in the above-described range by adjusting a sintering temperature and a sintering time.

Thermal Conductivity

Examples of techniques for confirming the thermal conductivity of the sintered phosphor-composite according to the present embodiment include methods of measurement performed by a steady heating method, a laser flash method, and a periodic heating method.

The thermal conductivity of the sintered phosphor-composite is typically 3.0 W/(m·K) or more, preferably 5.0 W/(m·K) or more, and more preferably 10.0 W/(m·K) or more. When the thermal conductivity is less than 3.0 W/(m·K), strong excitation light irradiation causes the temperature of the sintered composite to be increased, and the phosphor and surrounding members tend to be degraded. Therefore, the above-described range is preferred.

Absorptance

Examples of techniques for confirming the absorptance of the sintered phosphor-composite according to the present embodiment include a method of measurement performed by an absorptiometer (UV-Vis).

The absorptance of the sintered phosphor-composite is typically 10% or less, preferably 5.0% or less, more preferably 3.5% or less, and still more preferably 1.5% or less. When the absorptance is more than 10%, a luminous efficacy (internal quantum efficiency) and a transmittance tends to be reduced, thereby, reducing light extraction efficiency (conversion efficacy). Therefore, the above-described range is preferred.

Transmittance

Examples of techniques for confirming the transmittance of the sintered phosphor-composite according to the present embodiment include a method of measurement performed by an integrating sphere and a spectroscope.

The transmittance of the sintered phosphor-composite is typically 20% or more, preferably 25% or more, more preferably 30% or more, and still more preferably 40% or more when the transmittance of the sintered phosphor-composite in a geometry used in, for example, a light-emitting apparatus is measured at a wavelength 700 nm. When the transmittance is less than 20%, the amount of excitation light transmitting through the sintered phosphor-composite is reduced, it becomes difficult to achieve desired chromaticity, and light extraction efficiency (conversion efficacy) tends to be reduced.

Mechanical Strength

It is preferable that the sintered phosphor-composite according to the present embodiment has a mechanical strength to endure working (slicing, grinding, and polishing). A case in which the sintered phosphor-composite has an insufficient mechanical strength in working of the sintered phosphor-composite to have a plate shape or in incorporation of the sintered phosphor-composite into a light-emitting apparatus is unfavorable because of causing yield to be reduced in production and an incorporation method to be restricted.

Color Temperature CCT, Chromaticity Coordinates CIE-x, y

The color temperature of the sintered phosphor-composite according to the present embodiment is calculated from the color of emitted light including transmitted blue light obtained by irradiation of blue light with a peak wavelength of 450 nm emitted from an LED.

With regard to the color temperature of a sintered phosphor-composite used in a general illumination apparatus or the like, the color temperature of light emitted by excitation by blue light with a wavelength of 450 nm is typically 1900 K or more and 10000 K or less, and more generally 2700 K or more and 8000 K or less.

Internal Quantum Efficiency

The internal quantum efficiency (iQE) of the sintered phosphor-composite according to the present embodiment is calculated as $n_{em}/n_{ex}$ from the number $n_{ex}$ of photons absorbed by a sintered phosphor-composite irradiated with blue light having a peak wavelength of 450 nm and the number $n_{em}$ of photons in converted light into which absorbed photons are converted. For a high-luminance light-emitting apparatus in which the internal quantum efficiency of light emitted by excitation by blue light with a wavelength of 450 nm is typically 40% or more, the higher internal quantum efficiency of the sintered phosphor-composite is preferred, and the internal quantum efficiency is preferably 60% or more, more preferably 65% or more, still more preferably 70% or more, even more preferably 75% or more, and particularly preferably 80% or more. When the internal quantum efficiency is low, light extraction efficiency (conversion efficacy) tends to be reduced.

<3. Light-Emitting Apparatus>

Another embodiment of the present invention is a light-emitting apparatus including a sintered phosphor-composite or a plate-shaped sintered phosphor-composite and a semiconductor light emitting element.

As an example, the light-emitting apparatus according to the present embodiment includes a semiconductor blue light emitting element (blue light emitting diode or blue semiconductor laser) and the sintered phosphor-composite or plate-shaped sintered phosphor-composite according to the embodiment of the present invention, which is a wavelength conversion member that converts the wavelength of blue light. The semiconductor blue light emitting element and the sintered phosphor-composite or plate-shaped sintered phosphor-composite may be brought into intimate contact with each other or may be separated from each other, and transparent resin or a space may be included therebetween. As illustrated as a schematic view in FIG. 1, a structure including a space between the semiconductor light emitting element and the sintered phosphor-composite is preferred.

The configuration thereof will be described below with reference to FIG. 1 and FIG. 2.

Figure 2:
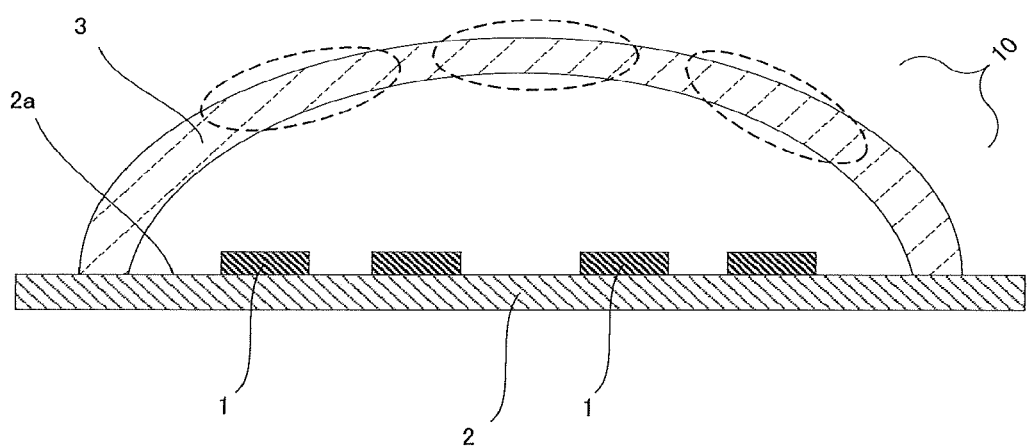
FIG. 2 is a schematic view illustrating a configuration example of the semiconductor light-emitting apparatus according to the aspect of the present invention.

FIG. 2 is a schematic view of the light-emitting apparatus according to the specific embodiment of the present invention.

A light-emitting apparatus 10 includes at least semiconductor blue light emitting elements 1 and a plate-shaped sintered phosphor-composite 3 as constitutional members. The semiconductor blue light emitting elements 1 emit excitation light for exciting a phosphor contained in the plate-shaped sintered phosphor-composite 3.

The semiconductor blue light emitting elements 1 typically emit excitation light having a peak wavelength of 425 nm to 475 nm, and preferably emit excitation light having a peak wavelength of 430 nm to 470 nm. The number of the semiconductor blue light emitting elements 1 can be set as appropriate according to the intensity of excitation light, required by the apparatus.

Instead of the semiconductor blue light emitting elements 1, semiconductor purple light emitting elements can be used. The semiconductor purple light emitting elements typically emit excitation light having a peak wavelength of 390 nm to 425 nm, and preferably emit excitation light having a peak wavelength of 395 to 415 nm.

The semiconductor blue light emitting elements 1 are mounted on a chip-mounted face 2a of a wiring substrate 2. A wiring pattern (not illustrated) for supplying an electrode to the semiconductor blue light emitting elements 1 is formed on the wiring substrate 2, and constitutes an electric circuit. A case in which the plate-shaped sintered phosphor-composite 3 is put on the wiring substrate 2 is illustrated in FIG. 2, but other cases may be acceptable, and the wiring substrate 2 and the plate-shaped sintered phosphor-composite 3, between which another member is interposed, may be arranged.

For example, in FIG. 1, the wiring substrate 2 and the plate-shaped sintered phosphor-composite 3, between which a frame 4 is interposed, are arranged. The frame 4 may have a tapered shape in order to allow light to have directivity. The frame 4 may also be a reflective material.

From the viewpoint of improving the luminous efficacy of the light-emitting apparatus 10, it is preferable that the wiring substrate 2 has excellent electrical insulation properties, favorable heat dissipation properties, and a high reflectance. However, a reflection plate having a high reflectance may also be disposed on a portion, on which the semiconductor blue light emitting elements 1 are absent, of the chip-mounted face of the wiring substrate 2 or on at least part of the inner surface of the other member that connects the wiring substrate 2 and the plate-shaped sintered phosphor-composite 3 to each other.

The plate-shaped sintered phosphor-composite 3 converts the wavelength of part of incident light emitted by the semiconductor blue light emitting elements 1, and radiates outgoing light of which the wavelength is different from that of the incident light. The plate-shaped sintered phosphor-composite 3 contains an inorganic binder and a nitride phosphor. The kinds of the nitride phosphor (not illustrated) or a garnet-based phosphor that emits yellow or green light and a nitride phosphor that emits red light are not particularly limited, but it is preferable to adjust the kind of the phosphor as appropriate so that white light is emitted according to the kind of excitation light from a semiconductor light emitting element when the light-emitting apparatus is a white light-emitting apparatus.

When the semiconductor light emitting element is a semiconductor blue light emitting element, the light-emitting apparatus can be allowed to emit white light by using a yellow phosphor as the nitride phosphor or by using a yellow phosphor or a green phosphor as the garnet-based phosphor and a red phosphor as the nitride phosphor. In addition, it is preferable that the plate-shaped sintered phosphor-composite 3 is spaced from the semiconductor blue light emitting elements 1. Between the plate-shaped sintered phosphor-composite 3 and the semiconductor blue light emitting element 1, there may be a space, or transparent resin may be included. The deterioration of the plate-shaped sintered phosphor-composite 3 and the phosphor included in the plate-shaped sintered phosphor-composite due to heat generated from the semiconductor blue light emitting elements 1 can be suppressed by an aspect in which the plate-shaped sintered phosphor-composite 3 and the semiconductor blue light emitting elements 1 are spaced from each other as described above. The spacing between the semiconductor blue light emitting elements 1 and the plate-shaped sintered phosphor-composite 3 is preferably 10 μm or more, still more preferably 100 μm or more, and particularly preferably 1.0 mm or more, and preferably 1.0 m or less, still more preferably 500 mm or less, and particularly preferably 100 mm or less.

It is preferable that the light-emitting apparatus according to the present embodiment is a light-emitting apparatus that radiates white light. In the light-emitting apparatus that radiates white light, it is preferable that the deviation duv of the color of light, radiated from the light-emitting apparatus, from a black-body radiation locus is −0.0200 to 0.0200 and the correlated color temperature of the light is 1800 K or more and 30000 K or less.

The light-emitting apparatus that emits white light is preferably included in an illumination apparatus as described above.

<4. Illumination Apparatus>

Another embodiment of the present invention is an illumination apparatus including the light-emitting apparatus described above.

A lighting fixture with a high total luminous flux can be obtained because a high total luminous flux is emitted from the light-emitting apparatus as described above. It is preferable to arrange a diffusion member covering the plate-shaped sintered phosphor-composite in the light-emitting apparatus in the lighting fixture so that the color of the plate-shaped sintered phosphor-composite is inconspicuous at lights out.

<5. Vehicular Headlamp>

Another embodiment of the present invention is a vehicular headlamp including the light-emitting apparatus described above.

It is preferable that the light-emitting apparatus used in the vehicular headlamp is a light-emitting apparatus that radiates white light. In the light-emitting apparatus that radiates white light, it is preferable that the deviation duv of the color of light, radiated from the light-emitting apparatus, from a black-body radiation locus is −0.0200 to 0.0200 and the color temperature of the light is 5000 K or more and 30000 K or less.

EXAMPLES

Specific aspects of the present invention will now be described in more detail with reference to examples. However, the present invention is not limited to the examples.

In the present specification, a sintering degree, an absorptance, a transmittance, a thermal conductivity, an internal quantum efficiency, and optical properties were measured as described below.

(Sintering Degree)

The sintering degree was calculated by dividing the density $\rho_a$ of a sintered phosphor-composite, measured by an Archimedes method, by a theoretical density $\rho_{theoretical}$.

Sintering degree (%)=($\rho_a/\rho_{theoretical}$)×100

(Thermal Conductivity)

The thermal conductivity of a sintered phosphor-composite was measured using a thermal conductivity measurement apparatus ai-Phase (manufactured by ai-Phase Co., Ltd.).

(Optical Properties)

There was produced a light-emitting apparatus capable of emitting light from a sintered phosphor-composite by irradiation of blue light emitted from an LED chip (peak wavelength of 450 nm) capable of performing irradiation of light having an intensity of 0.05 to 0.2 W/mm$^2$ by controlling current. Emission spectra from the apparatus were observed using a 20-inch integrating sphere, manufactured by Sphere Optics GmbH, and a spectroscope USB2000, manufactured by Ocean Optics Inc., to measure a correlated color temperature, chromaticity coordinates, and a luminous flux (lumen) in excitation by light having an optical power density of 0.05 W/mm$^2$. Further, a conversion efficacy (lm/W) was calculated at each intensity from the luminous flux (lumen) and the irradiation energy (W) of an LED chip.

Then, the absorptance and transmittance of the sintered phosphor-composite at an excitation wavelength of 700 nm were measured based on reflections and transmission spectra in irradiation of the sintered phosphor-composite using a xenon spectroscopic light source as a light source at an excitation wavelength set at 700 nm.

Subsequently, the excitation wavelength was changed to 450 nm, and the internal quantum efficiency of the sintered phosphor-composite at an excitation wavelength of 450 nm was measured based on reflections and transmission spectra in irradiation of the sintered phosphor-composite.

Reflections and transmission spectra were observed with a 20-inch integrating sphere (LMS-200) manufactured by Labsphere, Inc. and a spectroscope (Solid Lambda UV-Vis) manufactured by Carl Zeiss using a spectroscopic light source manufactured by Spectra Co-op.

Example 1

[Production of LSN Phosphor]
(Formulation of Raw Materials)

An alloy of La:Si=1:1 (molar ratio), Si$_3$N$_4$, and CeF$_3$ were weighed so that La:Si=3:6 (molar ratio) and CeF$_3$/(alloy+Si$_3$N$_4$)=6 wt % were achieved. The weighed raw materials were mixed in a ball mill, and then passed through a nylon mesh sieve to formulate the raw materials. The operation from the weighing to the formulation was performed in a glove box with a nitrogen atmosphere having an oxygen concentration of 1% or less, with the ball mill being exposed to atmospheric air in the state of a double container in which a poly-pot in which nitrogen was encapsulated was put in an airtight container in which nitrogen was similarly encapsulated. An iron ball coated with nylon was used as a medium (ball) in the ball mill.

(Burning Step)

A Mo crucible was filled with the formulated raw materials, and set in an electric furnace. The interior of the apparatus was evacuated, followed by raising a temperature in the furnace to 120° C. After confirmation that vacuum pressure was achieved in the furnace, a nitrogen gas containing hydrogen (nitrogen:hydrogen=96:4 (volume ratio)) was introduced until atmospheric pressure was achieved. Then, the temperature in the furnace was raised to 1550° C. and maintained at 1550° C. for 8 hours, followed by starting a decrease in temperature and ending burning treatment to obtain a phosphor.

(Washing Step)

The burnt phosphor was passed through a nylon mesh sieve, then ground in the ball mill, stirred in 1N hydrochloric acid for 1 hour or more, and then washed with water. Then, the resultant was dehydrated, dried by a hot air dryer at 120° C., and passed through the nylon mesh sieve to collect a phosphor.

(Vapor Heat Treatment)

The phosphor obtained in the washing step described above was put in a glass sample vial, and the sample vial was put in an autoclave (HICLAVE HG-50, manufactured by HIRAYAMA MANUFACTURING CORPORATION), and left standing for 20 hours. An environment in the autoclave was at 135° C. and 0.33 MPa under saturated water vapor. The pressure value described above was obtained by adding an ordinary pressure of 0.1 MPa to a pressure (pressure different from ordinary pressure) indicated by the apparatus. The phosphor left standing in the autoclave was dried by a hot air dryer at 140° C. for 2 hours, to obtain a final LSN phosphor 1 (La$_3$Si$_6$N$_{11}$:Ce).

In addition, a phosphor was produced as an LSN phosphor 2 in the same manner as that in Example 1 except that the vapor heat treatment was not performed.

Figure 3:
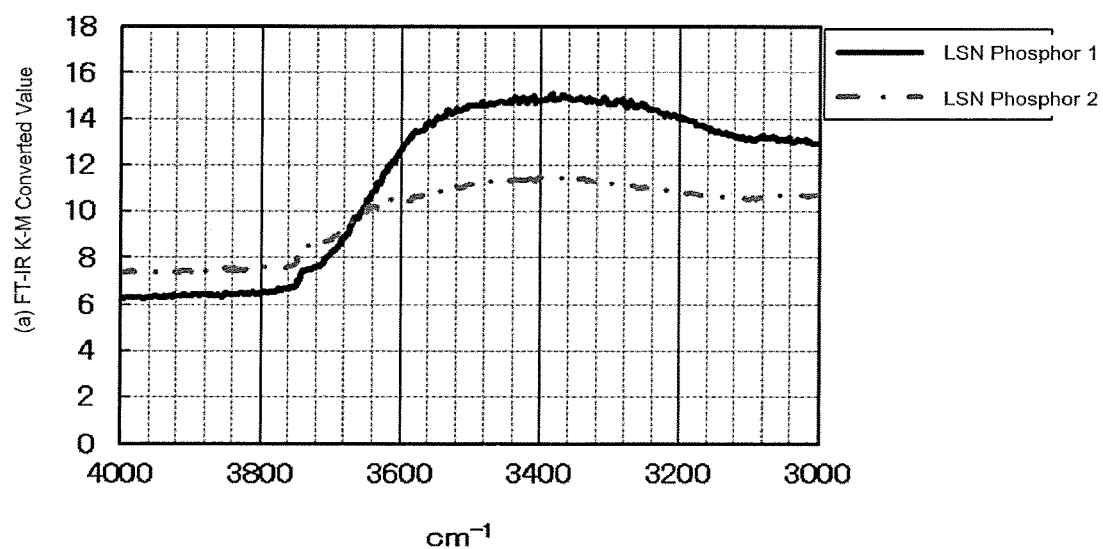
FIG. 3 is a graph of comparisons of converted values obtained by converting, into Kubelka-Munk function values, the infrared absorption spectra of an LSN phosphor 1 and an LSN phosphor 2 used in Examples or Comparative Examples of the present invention.

The values of Kubelka-Munk functions into which the infrared absorption spectra of the obtained LSN phosphors 1 and 2 are converted are indicated in FIG. 3, respectively. FIG. 3 reveals that adsorbed water or an oxygen-containing layer exists on a surface of the LSN phosphor 1.

[Production of Sintered Phosphor-Composite]

Each of 10.0 g of a CaF$_2$ powder (Kojundo Chemical Laboratory Co., Ltd., weight average median diameter of 13 μm) used as a fluoride inorganic binder material in a sintered phosphor-composite and 0.8 g of the LSN phosphor 1 (La$_3$Si$_6$N$_{11}$:Ce) obtained in the example, as a phosphor, was weighed so that the concentration of the phosphor in the sintered composite was 5% by volume. The CaF$_2$ powder and the LSN phosphor 1 were mixed. To these powders, 50 g of alumina beads of 3 mm in diameter were added. The resultant was dry-mixed for 6 hours by a ball mill and was then sieved (sieve having an opening of 90 μm) to offer a raw material for sintering.

In a uniaxial pressing die (made of stainless steel and having a diameter of 20 mm) including an upper punch, a lower punch, and a columnar die, 2.0 g of the raw material was set, then pressed and pressurized at 30 MPa, and retained for 5 min, to then obtain pellets of 20 mm in diameter and 3 mm in thickness.

The obtained pellets were vacuum-lamination-packed, introduced into a cold isostatic pressing (CIP) apparatus (NIKKISO CO., LTD., rubber press), and pressurized at 300 MPa for 1 min. Then, the resultant was introduced into a burning furnace (tubular furnace) (Irie Seisakusho, tubular furnace IRH), its temperature was raised to 1200° C. at 10° C./min and maintained for 60 min, and the furnace was then cooled to obtain a sintered composite having a diameter of 20 mm and a thickness of 3 mm.

As a result of measuring its sintering degree, the sintering degree was 93%.

The obtained sintered phosphor-composite having a diameter of 20 mm and a thickness of 5 mm was cut to have a thickness of around 0.5 mm with a diamond cutter and was further ground by a grinder to produce a plate-shaped sintered phosphor-composite having a diameter of 20 mm and a thickness of 0.2 mm. A sintering degree, a thermal conductivity, the absorptance of light with a wavelength of 700 nm, a transmittance at a wavelength of 700 nm, an internal quantum efficiency, a conversion efficacy, chromaticity coordinates, and a correlated color temperature, measured using the plate-shaped sintered phosphor-composite, are listed in Table 1 and Table 2.

Example 2

A sintered phosphor-composite was produced in the same manner as that in Example 1 except that the particle diameter of a $CaF_2$ powder as a fluoride inorganic binder was set at 0.5 μm. Evaluations thereof were performed.

Example 3

A sintered phosphor-composite was produced in the same manner as that in Example 1 except that the particle diameter of a $CaF_2$ powder as a fluoride inorganic binder was set at 30 nm. Evaluations thereof were performed.

Example 4

A sintered phosphor-composite was produced in the same manner as that in Example 2 except that the LSN phosphor 1 and a CASN phosphor (having an average particle diameter of 9 μm, manufactured by Mitsubishi Chemical Corporation) were added so that the total concentration of the phosphors in the sintered composite was 5% by volume and except that a weight ratio between the phosphors of 9:1 was achieved. Evaluations thereof were performed.

Example 5

A sintered phosphor-composite was produced in the same manner as that in Example 2 except that a CASN phosphor (having an average particle diameter of 9 μm, manufactured by Mitsubishi Chemical Corporation) was used instead of the LSN phosphor 1. Evaluations thereof were performed.

Example 6

A sintered phosphor-composite was produced in the same manner as that in Example 2 except that β-SiALON (having an average particle diameter of 22 μm, manufactured by Mitsubishi Chemical Corporation) was used instead of the LSN phosphor 1. Evaluations thereof were performed.

Example 7

A sintered phosphor-composite was produced in the same manner as that in Example 2 except that SCASN (having an average particle diameter of 14 μm, manufactured by Mitsubishi Chemical Corporation) was used instead of the LSN phosphor 1. Evaluations thereof were performed.

Example 8

A sintered phosphor-composite was produced in the same manner as that in Example 4 except that YAG (having an average particle diameter of 17 μm, manufactured by Mitsubishi Chemical Corporation) was used instead of the LSN phosphor 1. Evaluations thereof were performed.

Example 9

A sintered phosphor-composite was produced in the same manner as that in Example 4 except that LuAG (having an average particle diameter of 9 μm, manufactured by Mitsubishi Chemical Corporation) was used instead of the LSN phosphor 1. Evaluations thereof were performed.

Example 10

A sintered phosphor-composite was produced in the same manner as that in Example 2 except that $(Sr, Ca, Ba)_2Al_x Si_{5-x}O_xN_{8-x}:Eu$ (0≤x≤2 in the formula) (average particle diameter of 7 μm) was used instead of the LSN phosphor 1. Evaluations thereof were performed.

Example 11

A sintered phosphor-composite was produced in the same manner as that in Example 1 except that instead of $CaF_2$, $SrF_2$ (weight average median diameter of 0.5 μm) was used as a fluoride inorganic binder material. Evaluations thereof were performed.

Comparative Example 1

Production of pellets was performed by a uniaxial pressing machine in the same manner as that in Example 1 except that an $\alpha\text{-}Al_2O_3$ powder having a particle diameter of 20 μm (Wako Pure Chemical Industries, Ltd.) was used as an inorganic binder in a sintered phosphor-composite. Production and evaluations of the sintered phosphor-composite were performed. However, the pellets were unable to be produced.

Comparative Example 2

Production and evaluations of a sintered phosphor-composite were performed in the same manner as that in Example 1 except that an $\alpha\text{-}Al_2O_3$ powder having a particle diameter of 0.3 μm (Wako Pure Chemical Industries, Ltd.) was used as an inorganic binder in the sintered phosphor-composite.

Comparative Example 3

Production and evaluations of a sintered phosphor-composite were performed in the same manner as that in Example 1 except that an $\alpha\text{-}Al_2O_3$ powder having a particle diameter of 0.15 µm (TM-DAR from TAIMEI CHEMICALS CO., LTD.) was used as an inorganic binder in the sintered phosphor-composite.

Comparative Example 4

Production and evaluations of a sintered phosphor-composite were performed in the same manner as that in Example 1 except that an α-$Al_2O_3$ powder having a particle diameter of 0.15 µm (TM-DAR from TAIMEI CHEMICALS CO., LTD.) was used as an inorganic binder in the sintered phosphor-composite and that a sintering temperature was set at 600° C. However, since a sintering degree was low and working was difficult, evaluation results were unable to be obtained.

Comparative Example 5

A sintered phosphor-composite was produced and evaluations thereof were performed in the same manner as that in Comparative Example 2 except that a CASN phosphor (having an average particle diameter of 9 µm, manufactured by Mitsubishi Chemical Corporation) was used instead of the LSN phosphor 1. However, evaluation results were unable to be obtained due to the deterioration of the phosphor.

Comparative Example 6

Production and evaluations of a sintered phosphor-composite were performed in the same manner as that in Comparative Example 2 except that a YAG phosphor (having an average particle diameter of 17 µm, manufactured by Mitsubishi Chemical Corporation) was used instead of the LSN phosphor 1 and that a $CaF_2$ powder (particle diameter of 0.5 µm) was used as an inorganic binder in the sintered phosphor-composite.

Comparative Example 7

A sintered phosphor-composite was produced and evaluations thereof were performed in the same manner as that in Comparative Example 3 except that the kinds of phosphors were a CASN phosphor (having an average particle diameter of 9 µm, manufactured by Mitsubishi Chemical Corporation) and a YAG phosphor (having an average particle diameter of 17 µm, manufactured by Mitsubishi Chemical Corporation) and that the weight ratio of the phosphors was set at 1:9 although the total amount of the phosphors remained unchanged at 5% by volume.

Comparative Example 8

A sintered phosphor-composite was produced and evaluations thereof were performed in the same manner as that in Comparative Example 3 except that a SCASN phosphor (having an average particle diameter of 14 µm, manufactured by Mitsubishi Chemical Corporation) was used instead of the LSN phosphor 1 and that a sintering temperature was set at 1300° C. under a nitrogen and hydrogen atmosphere.

Comparative Example 9

A sintered phosphor-composite was produced and evaluations thereof were performed in the same manner as that in Comparative Example 3 except that a CASN phosphor (having an average particle diameter of 9 µm, manufactured by Mitsubishi Chemical Corporation) was used instead of the LSN phosphor 1 and that a sintering temperature was set at 1300° C. under a nitrogen and hydrogen atmosphere.

Comparative Example 10

Production of a sintered phosphor-composite was attempted in the same manner as that in Example 8 except that no fluoride inorganic binder material was used. However, pellets were unable to be produced.

The evaluation results of Examples and Comparative Examples above are described in Table 1 to Table 4.

TABLE 1

| | Phosphor | Inorganic Binder | Crystal System | Particle Diameter of Inorganic Binder µm | Phosphor Concentration vol % | Pellet Moldability | Sintering Temperature ° C. | Thickness mm | Sintering Degree % |
|---|---|---|---|---|---|---|---|---|---|
| Example 1 | LSN Phosphor 1 | $CaF_2$ | Cubic | 13 | 5 | Good | 1200 | 0.2 | 93 |
| Example 2 | LSN Phosphor 1 | $CaF_2$ | Cubic | 0.5 | 5 | Good | 1200 | 0.2 | 98 |
| Example 3 | LSN Phosphor 1 | $CaF_2$ | Cubic | 0.03 | 5 | Good | 600 | 0.4 | 99 |
| Comparative Example 1 | LSN Phosphor 1 | Alumina | Trigonal | 20 | 5 | Poor | | | |
| Comparative Example 2 | LSN Phosphor 1 | Alumina | Trigonal | 0.3 | 5 | Fair | 1200 | 0.2 | 90 |
| Comparative Example 3 | LSN Phosphor 1 | Alumina | Trigonal | 0.15 | 5 | Fair | 1200 | 0.2 | 98 |
| Comparative Example 4 | LSN Phosphor 1 | Alumina | Trigonal | 0.15 | 5 | Fair | 600 | — | 61 |

TABLE 2

| | Thermal Conductivity W/(m · K) | Absorptance % | Transmittance % | iQE % | CCTK | CIE-x | CIE-y | CE lm/Wopt |
|---|---|---|---|---|---|---|---|---|
| Example 1 | 7 | 4.1 | 32 | 68 | 4554 | 0.3726 | 0.4440 | 83 |
| Example 2 | 6 | 1.2 | 55 | 82 | 6674 | 0.3099 | 0.3269 | 143 |
| Example 3 | 6 | 3.1 | 28 | 77 | 6924 | 0.3063 | 0.3233 | 136 |

TABLE 2-continued

|  | Thermal Conductivity W/(m · K) | Absorptance % | Transmittance % | iQE % | CCTK | CIE-x | CIE-y | CE lm/Wopt |
|---|---|---|---|---|---|---|---|---|
| Comparative Example 1 |  |  |  |  |  |  |  |  |
| Comparative Example 2 | 10 | 8.5 | 8.5 | 47 | 9808 | 0.3033 | 0.2464 | 6 |
| Comparative Example 3 | 7 | 3.7 | 13 | 67 | 4242 | 0.3773 | 0.4012 | 15 |
| Comparative Example 4 |  |  |  |  |  |  |  |  |

TABLE 3

|  | Phosphor | Inorganic Binder | Crystal System | Particle Diameter of Inorganic Binder μm | Phosphor Concentration vol % | Pellet Moldability | Sintering Temperature ° C. | Thickness mm | Sintering Degree % |
|---|---|---|---|---|---|---|---|---|---|
| Example 4 | LSN Phosphor 1 + CASN | CaF$_2$ | Cubic | 0.5 | 5 | Good | 1200 | 0.2 | 96 |
| Example 5 | CASN | CaF$_2$ | Cubic | 0.5 | 5 | Good | 1200 | 0.2 | 92 |
| Example 6 | β-SiALON | CaF$_2$ | Cubic | 0.5 | 5 | Good | 1200 | 0.2 | 89 |
| Example 7 | SCASN | CaF$_2$ | Cubic | 0.5 | 5 | Good | 1200 | 0.2 | 92 |
| Example 8 | YAG + CASN | CaF$_2$ | Cubic | 0.5 | 5 | Good | 1200 | 0.2 | 85 |
| Example 9 | LuAG + CASN | CaF$_2$ | Cubic | 0.5 | 5 | Good | 1200 | 0.2 | 93 |
| Example 10 | 258 | CaF$_2$ | Cubic | 0.5 | 5 | Good | 1200 | 0.2 | 98 |
| Example 11 | LSN Phosphor 1 | SrF$_2$ | Cubic | 0.5 | 5 | Good | 1200 | 0.2 | 95 |
| Comparative Example 5 | CASN | Alumina | Trigonal | 0.3 | 5 | Fair | 1200 |  |  |
| Comparative Example 6 | YAG | CaF$_2$ | Cubic | 0.5 | 5 | Good | 1200 | 0.2 | 89 |
| Comparative Example 7 | YAG + CASN | Alumina | Trigonal | 0.15 | 5 | Fair | 1200 | 0.2 | 93 |
| Comparative Example 8 | SCASN | Alumina | Trigonal | 0.15 | 5 | Fair | 1300N$_2$H$_2$ | 0.2 | 73 |
| Comparative Example 9 | CASN | Alumina | Trigonal | 0.15 | 5 | Fair | 1300N$_2$H$_2$ | 0.2 | 75 |
| Comparative Example 10 | YAG + CASN | — | — | — | — | Poor |  |  |  |

TABLE 4

|  | Thermal Conductivity W/(m · K) | Absorptance % | Transmittance % | iQE % | CCTK | CIE-x | CIE-y | CE lm/Wopt |
|---|---|---|---|---|---|---|---|---|
| Example 4 | 5.2 | 3.0 | 46 | 69 | 7321 | 0.3056 | 0.2993 | 160 |
| Example 5 | 4.9 | 2.0 | 45 | 67 | 3695 | 0.3076 | 0.1225 | 29 |
| Example 6 | 5.9 | 1.7 | 52 | 67 |  | 0.1965 | 0.1658 | 88 |
| Example 7 | 5.1 | 1.2 | 43 | 72 | 1429 | 0.4354 | 0.2203 | 47 |
| Example 8 | 6.1 | 2.2 | 40 | 69 | 3539 | 0.4566 | 0.5363 | 240 |
| Example 9 | 5.7 | 2.5 | 44 | 74 | 9742 | 0.2770 | 0.3004 | 97 |
| Example 10 | 3.9 | 4.6 | 32 | 65 | 7739 | 0.3042 | 0.2858 | 9 |
| Example 11 | 4.5 | 3.1 | 42 | 78 | 4598 | 0.3712 | 0.4478 | 112 |
| Comparative Example 5 |  |  |  |  |  |  |  |  |
| Comparative Example 6 | 5.5 | 0.1 | 42 | 82 | 6032 | 0.3195 | 0.3581 | 114 |
| Comparative Example 7 | 9.6 | 10.8 | 15 | 44 | 7739 | 0.3042 | 0.2858 | 9 |
| Comparative Example 8 | 10.1 | 8.5 | 15 | 9 |  | 0.273 | 0.086 | 1 |
| Comparative Example 9 | 12.3 | 7.3 | 17 | 30 | 3756 | 0.3041 | 0.1089 | 4 |
| Comparative Example 10 |  |  |  |  |  |  |  |  |

Reference Example 1

Each of 18.8 g of an $\alpha$-$Al_2O_3$ powder (having a weight average median diameter of 0.15 µm, TAIMICRON TM-DAR, manufactured by TAIMEI CHEMICALS CO., LTD.) used as an inorganic binder material in a sintered phosphor-composite and 1.2 g of the LSN phosphor 1 ($La_3Si_6N_{11}$:Ce) obtained in the example, as a phosphor, was weighed so that the concentration of the phosphor in the sintered composite was 5% by volume. The $\alpha$-$Al_2O_3$ powder and the LSN phosphor 1 were mixed. To these powders, 150 g of alumina beads of 3 mm in diameter were added. The resultant was dry-mixed for 6 hours by a ball mill and was then sieved (sieve made of stainless steel having an opening of 90 µm) to offer a raw material for sintering.

In a die for sintering (made of carbon and having a diameter of 20 mm) including an upper punch, a lower punch, and a columnar die, 6.5 g of the raw material was set and then pre-pressed. Then, the raw material was set in a discharge plasma sintering apparatus (Dr. Sinter SPS515, manufactured by Fuji Electronic Industrial Co., Ltd.). In the sintering, the upper and lower punches were pressed and pressurized at 50 MPa under a vacuum of 5 Pa, a temperature was raised to 1300° C. at 100° C./min and maintained for 10 min, and the furnace was then cooled to obtain a sintered phosphor-composite having a diameter of 20 mm and a thickness of 5 mm.

As a result of removing carbon adhering to a surface of the sintered composite during the sintering and of measuring its sintering degree, the sintering degree was 99.9%, indicating that the sintering proceeded approximately to a theoretical density.

The obtained sintered phosphor-composite having a diameter of 20 mm and a thickness of 5 mm was cut to have a thickness of around 0.5 mm with a diamond cutter and was further ground by a grinder to produce a sintered phosphor-composite plate having a diameter of 20 mm and a thickness of 0.3 mm. A sintering degree, a thermal conductivity, the absorptance of light with a wavelength of 700 nm, an internal quantum efficiency, a conversion efficacy, chromaticity coordinates, a correlated color temperature, a chromaticity difference and the rate of change of conversion efficacy with respect to a change in excitation intensity, and a chromaticity difference and the rate of change of conversion efficacy with respect to a temperature change, measured using the sintered phosphor-composite plate, are listed in Tables 5 and 6. The conversion efficacy, the chromaticity coordinates, and the correlated color temperature are values measured in excitation by light with an intensity of 0.05 $W/mm^2$.

Reference Example 2

Each of 6.0 g of a $CaF_2$ powder (having a particle diameter of 13 µm, CAH20PB, manufactured by Kojundo Chemical Laboratory Co., Ltd.) used as a matrix (inorganic binder) material in a sintered phosphor-composite and 0.5 g of the LSN phosphor 1 as a phosphor was weighed and mixed so that the concentration of the phosphor in the sintered composite was 5% by volume, to offer a raw material for sintering.

In a uniaxial pressurization pressing machine, 2.0 g of the raw material was set and molded at a pressure of 300 MPa to produce pellets having a diameter of 20 mm and a thickness of 2 mm. The obtained pellets were set in a tubular furnace (Irie Seisakusho), the temperature thereof was raised to 1250° C. at 10° C./min under nitrogen flow (1 liter/min) and maintained for 60 min, and the furnace was then cooled to obtain a sintered phosphor-composite.

Evaluations of the obtained sintered phosphor-composite were performed similarly with Reference Example 1.

Reference Example 3

The matrix material of a sintered phosphor-composite was not used, 6.5 g of only the LSN phosphor 1 as a phosphor was weighed, and the sintered phosphor-composite was produced and evaluations thereof were performed similarly with Reference Example 1.

TABLE 5

| | Phosphor | Inorganic Binder | Phosphor Concentration % by volume | Sintering Degree | Thermal Conductivity W/(m · K) | Light Absorptance % | Mechanical Strength | Internal Quantum Efficiency % |
|---|---|---|---|---|---|---|---|---|
| Reference Example 1 | LSN Phosphor 1 | Alumina | 5 | 99.9 | 27.0 | 19.0 | A | 48 |
| Reference Example 2 | LSN Phosphor 1 | $CaF_2$ | 5 | 93.0 | 5.0 | 5.7 | A | 66 |
| Reference Example 3 | LSN Phosphor 1 | None | 100 | 80.0 | 7.0 | 64.0 | C | 19 |

TABLE 6

| | Conversion efficacy lm/Wopt | Chromaticity Coordinates CIE-x, y | Color Temperature K | Chromaticity Difference with Respect to Change in Excitation Intensity | |
|---|---|---|---|---|---|
| | | | | $x_2 - x_1$ | $y_2 - y_1$ |
| Reference Example 1 | 140 | 0.305, 0.315 | 7100 | −0.002 | 0.006 |
| Reference Example 2 | 132 | 0.437, 0.505 | 3700 | −0.008 | −0.004 |
| Reference Example 3 | ≤ Detection limit | ≤ Detection limit | ≤ Detection limit | ≤ Detection limit | ≤ Detection limit |

TABLE 6-continued

| | Rate of Change of Conversion efficacy with Respect to Change in Excitation Intensity | Chromaticity Difference with Respect to temperature change | | Rate of Change of Conversion efficacy with Respect to Temperature Change |
|---|---|---|---|---|
| | CE2/CE1 | $x_2(150) - x_1(25)$ | $y_2(150) - y_1(25)$ | BR(150)/BR(25) |
| Reference Example 1 | 1.005 | 0.000 | 0.004 | 0.71 |
| Reference Example 2 | 0.944 | −0.007 | 0.002 | 0.63 |
| Reference Example 3 | ≤ Detection limit | −0.002 | −0.003 | 0.65 |

The above-described examples reveal that a higher internal quantum efficiency is obtained in the case of using $CaF_2$ as an inorganic binder than in the case of using $Al_2O_3$ as an inorganic binder. It is considered that when an oxide phosphor and a fluoride inorganic binder are sintered, the ionic radii of oxygen in the phosphor and fluorine in the inorganic binder are close to each other, therefore, solid solution substitution commonly occurs, an acid fluoride is formed, and an internal quantum efficiency is caused to be reduced. In contrast, it is considered that when the nitride phosphor and the fluoride inorganic binder were sintered, solid solution substitution did not easily occur in nitrogen and fluorine of which the ionic radii are different from each other, and therefore, an internal quantum efficiency was prevented from being reduced. In addition, in the case of using a fluoride inorganic binder, a sintering temperature was able to be reduced in comparison with, for example, the case of using $Al_2O_3$ as an inorganic binder, and therefore, a reaction between the nitride phosphor and the inorganic binder was able to be suppressed, thereby obtaining the sintered phosphor-composite of the nitride phosphor with a high internal quantum efficiency. Further, it is considered that for example, $Al_2O_3$ of which the crystal system is a trigonal system is birefringent and therefore results in insufficient light-transmitting properties in a polycrystalline substance whereas a fluoride inorganic binder, of which the $CaF_2$ crystal system is cubic, is not birefringent and enables a sintered phosphor-composite with high light-transmitting properties to be produced.

As above, it is found that a sintered phosphor-composite having a high internal quantum efficiency, a high transmittance, a low absorptance, and high thermal conductivity as well as a light-emitting apparatus excellent in optical and temperature properties can be obtained by using the sintered phosphor-composite of the present invention.

While the invention has been described in detail and with reference to specific embodiments thereof, it will be apparent to one skilled in the art that various changes and modifications can be made therein without departing from the spirit and scope thereof.

REFERENCE SIGNS LIST

10 Light-emitting apparatus
1 Semiconductor blue light emitting element
2 Wiring substrate
2a Chip-mounted face
3 Plate-shaped sintered phosphor-composite
4 Frame

The invention claimed is:

1. A sintered phosphor-composite, comprising:
   a nitride phosphor; and
   a fluoride inorganic binder that is a cubic crystal,
   wherein the sintered phosphor-composite is a plate-like sintered phosphor-composite, and the plate-like sintered phosphor-composite has a thickness of 50 μm or more and 2000 μm or less.

2. The sintered phosphor-composite according to claim 1, wherein the sintered phosphor-composite has a transmittance of 20% or more at a wavelength of 700 nm, and the sintered phosphor-composite has an internal quantum efficiency of 60% or more when being excited by blue light having a wavelength of 450 nm.

3. A light-emitting apparatus, comprising:
   the sintered phosphor-composite according to claim 1; and
   an LED or a semiconductor laser as a light source,
   wherein the sintered phosphor-composite absorbs at least part of light from the light source and emits light having a different wavelength.

4. An illumination apparatus comprising the light-emitting apparatus according to claim 3.

5. A vehicular headlamp comprising the light-emitting apparatus according to claim 3.

6. A method for producing the sintered phosphor-composite of claim 1, the method comprising:
   mixing a nitride phosphor and a fluoride inorganic binder, to obtain a mixture; and
   sintering the mixture at a temperature of 400° C. or more and 1500° C. or less.

7. The sintered phosphor-composite according to claim 1, further comprising:
   a garnet-based phosphor that emits yellow or green light;
   wherein the nitride phosphor emits red light.

8. The sintered phosphor-composite according to claim 7, wherein the garnet phosphor that emits yellow or green light comprises at least one of garnet phosphor elected from the group consisting of a YAG phosphor represented by the following general formula (1), a GYAG phosphor represented by the general formula (2), an LuAG phosphor represented by the general formula (3), and a phosphor represented by the general formula (4):

$$Y_a(Tb,Lu)_b(Ga,Sc)_cAl_dO_e:Ce \quad (1)$$

(a+b=3, 0≤b≤0.2, 4.5≤c+d≤5.5, 0≤c≤0.2, and 10.8≤e≤13.4 in the formula (1));

$$Y_a(Tb,Gd,Lu)_b(Ga,Sc)_cAl_dO_e:Ce \quad (2)$$

(a+b=3, 0≤b≤0.2, 4.5≤c+d≤5.5, 1.2≤c≤2.6, and 10.8≤e≤13.4 in the formula (2));

$$Lu_a(Tb,Gd,Y)_b(Ga,Sc)_cAl_dO_e:Ce \quad (3)$$

($a+b=3$, $0 \leq c \leq 0.2$, $4.5 \leq c+d \leq 5.5$, $0 \leq d \leq 0.2$, and $10.8 \leq e \leq 13.4$ in the formula (3)); and $$Y_a Tb_f(Gd,Lu)_b(Ga,Sc)_c Al_d O_e:Ce \qquad (4)$$

($a+b+f=3$, $0 \leq b \leq 0.2$, $4.5 \leq c+d \leq 5.5$, $0 \leq c \leq 2.6$, $10.8 \leq e \leq 13.4$, and $0.1 \leq f \leq 1$ in the formula (4)).

9. The sintered phosphor-composite according to claim 7, wherein the nitride phosphor that emits red light comprises at least one of nitride phosphors selected from the group consisting of CASN represented by the following general formula: $CaAlSiN_3$:Eu, SCASN represented by the following general formulae: $(Ca, Sr, Ba, Mg)AlSiN_3$:Eu and/or $(Ca, Sr, Ba)AlSiN_{3-x}O_x$:Eu ($0<x<3$ in the formula), and $Sr_2Si_5N_8$ represented by the following general formula: $(Sr, Ca, Ba)_2Al_xSi_{5-x}O_xN_{8-x}$:Eu ($0 \leq x \leq 2$ in the formula).

10. The sintered phosphor-composite according to claim 1, wherein the nitride phosphor comprises at least one selected from the group consisting of CASN represented by the following general formula: $CaAlSiN_3$:Eu, SCASN represented by the following general formulae: $(Ca, Sr, Ba, Mg)AlSiN_3$:Eu and/or $(Ca, Sr, Ba)AlSiN_{3-x}O_x$:Eu ($0<x<3$ in the formula), $Sr_2Si_5N_8$ represented by the following general formula: $(Sr, Ca, Ba)_2Al_xSi_{5-x}O_xN_{8-x}$:Eu ($0 \leq x \leq 2$ in the formula), LSN represented by the following general formula: $Ln_xSi_yN_n$:Z (wherein Ln is a rare-earth element except an element used as an activator; Z is the activator; and $2.7 \leq x \leq 3.3$, $5.4 \leq y \leq 56.6$, and $10 \leq n \leq 12$ are satisfied), and β-sialon represented by the following general formula: $Si_{6-z}Al_zO_xN_{8-z}$:Eu ($0<z<4.2$ in the formula).

* * * * *